United States Patent
Yamazaki

(10) Patent No.: US 8,293,661 B2
(45) Date of Patent: Oct. 23, 2012

(54) SEMICONDUCTOR DEVICE AND MANUFACTURING METHOD THEREOF

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 97 days.

(21) Appl. No.: 12/958,682

(22) Filed: Dec. 2, 2010

(65) Prior Publication Data

US 2011/0133180 A1  Jun. 9, 2011

(30) Foreign Application Priority Data

Dec. 8, 2009 (JP) ................. 2009-279001

(51) Int. Cl.
*H01L 21/469* (2006.01)
*H01L 21/31* (2006.01)
*H01L 21/324* (2006.01)
*H01L 21/4763* (2006.01)

(52) U.S. Cl. ......... 438/787; 438/770; 438/795; 438/585

(58) Field of Classification Search .................. 438/787, 438/770, 795, 585
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,569,780 B2 * | 5/2003 | Tanabe et al. | 438/770 |
| 6,727,522 B1 | 4/2004 | Kawasaki et al. | |
| 7,049,190 B2 | 5/2006 | Takeda et al. | |
| 7,053,007 B2 * | 5/2006 | Tanabe et al. | 438/770 |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |

(Continued)

FOREIGN PATENT DOCUMENTS

EP 1737044 A 12/2006

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Luan C Thai

(74) *Attorney, Agent, or Firm* — Eric J. Robinson; Robinson Intellectual Property Law Office, P.C.

(57) ABSTRACT

One embodiment of the present invention is to achieve high mobility in a device using an oxide semiconductor and provide a highly reliable display device. An oxide semiconductor layer including a crystal region in which c-axis is aligned in a direction substantially perpendicular to a surface is formed and an oxide insulating layer is formed over and in contact with the oxide semiconductor layer. Oxygen is supplied to the oxide semiconductor layer by third heat treatment. A nitride insulating layer containing hydrogen is formed over the oxide insulating layer and fourth heat treatment is performed, so that hydrogen is supplied at least to an interface between the oxide semiconductor layer and the oxide insulating layer.

11 Claims, 13 Drawing Sheets

U.S. PATENT DOCUMENTS

| | | | |
|---|---|---|---|
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,524,713 B2 | 4/2009 | Miyairi et al. | |
| 7,674,650 B2 | 3/2010 | Akimoto et al. | |
| 7,732,819 B2 | 6/2010 | Akimoto et al. | |
| 8,115,206 B2* | 2/2012 | Sakakura et al. | 257/66 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287221 A1 | 12/2007 | Ong et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0246064 A1* | 10/2008 | Kimura | 257/292 |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1* | 10/2008 | Kim et al. | 257/43 |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0142888 A1* | 6/2009 | Tsuchiya | 438/151 |
| 2009/0152506 A1 | 6/2009 | Umeda et al. | |
| 2009/0152541 A1 | 6/2009 | Maekawa et al. | |
| 2009/0261444 A1 | 10/2009 | Yamazaki et al. | |
| 2009/0278122 A1 | 11/2009 | Hosono et al. | |
| 2009/0280600 A1 | 11/2009 | Hosono et al. | |
| 2009/0283763 A1 | 11/2009 | Park et al. | |
| 2009/0289341 A1* | 11/2009 | Yamazaki et al. | 257/679 |
| 2009/0310734 A1 | 12/2009 | Umezaki | |
| 2010/0051938 A1 | 3/2010 | Hayashi et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0123130 A1 | 5/2010 | Akimoto et al. | |
| 2010/0163874 A1 | 7/2010 | Koyama et al. | |
| 2010/0193782 A1 | 8/2010 | Sakata | |
| 2011/0062432 A1 | 3/2011 | Yamazaki et al. | |
| 2011/0062436 A1 | 3/2011 | Yamazaki et al. | |
| 2011/0068335 A1 | 3/2011 | Yamazaki et al. | |
| 2011/0127521 A1 | 6/2011 | Yamazaki | |
| 2011/0127579 A1 | 6/2011 | Yamazaki | |
| 2011/0133179 A1 | 6/2011 | Yamazaki | |
| 2011/0151618 A1 | 6/2011 | Yamazaki et al. | |

FOREIGN PATENT DOCUMENTS

| | | |
|---|---|---|
| EP | 2120267 | 11/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-298062 | 10/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-278115 | 11/2009 |
| JP | 2010-040552 | 2/2010 |
| WO | WO-2004/114391 | 12/2004 |
| WO | WO-2009/034953 | 3/2009 |
| WO | WO-2009/091013 | 7/2009 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (M = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-InIO3-ZnO) TFT,", SID Digest '08 : SID International Symposium Digest of Technical Papers, May 20, 2008, vol. 39, pp. 633-636.

Lee. J et al., "World's Largest (15-Inch) XGA AMLCD Panel using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MO03 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09: Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 ; SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura. M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the In2O3 and SC2O3-A2O3-BO Systems [A; FE, GA, OR AL; B: MG, MN, FE, NI, CU,OR ZN] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

International Search Report (Application No. PCT/JP2010/070629) Dated Jan. 18, 2011.

Written Opinion (Application No. PCT/JP2010/070629) Dated Jan. 18, 2011.

* cited by examiner

SEMICONDUCTOR DEVICE AND MANUFACTURING METHOD THEREOF

TECHNICAL FIELD

The present invention relates to a semiconductor device having a circuit including at least a semiconductor element such as a transistor as one element, and a manufacturing method thereof. For example, the present invention relates to a power device which is mounted on a power supply circuit; a semiconductor integrated circuit including a memory, a thyristor, a converter, an image sensor, or the like; and an electronic appliance on which an electro-optical device typified by a liquid crystal display panel or a light-emitting display device including an organic light-emitting element is mounted as a component.

Note that in this specification, semiconductor devices refer to all devices which can function by utilizing semiconductor characteristics, and electro-optical devices, semiconductor circuits, and electronic appliances are all included in the category of semiconductor devices.

BACKGROUND ART

Transistors formed over a glass substrate or the like have been manufactured using amorphous silicon, polycrystalline silicon, or the like, as typically seen in liquid crystal display devices. Although transistors using amorphous silicon have low field-effect mobility, they can be formed over a larger glass substrate. Transistors using polycrystalline silicon have high field-effect mobility, but they are not suitable for a larger glass substrate.

Instead of a transistor using silicon, attention has been drawn to a technique by which a transistor is manufactured using an oxide semiconductor and applied to an electronic device or an optical device. For example, Patent Document 1 and Patent Document 2 disclose a technique by which a transistor is manufactured using zinc oxide or an In—Ga—Zn—O-based oxide as an oxide semiconductor and such a transistor is used as a switching element or the like of a pixel of a display device.

REFERENCE

Patent Document

[Patent Document 1] Japanese Published Patent Application No. 2007-123861
[Patent Document 2] Japanese Published Patent Application No. 2007-96055

DISCLOSURE OF INVENTION

In addition, large-sized display devices have been spread. Televisions each having a display screen with a diagonal dimension of 40 inches to 50 inches have been spread also as home-use televisions.

A conventional transistor using an oxide semiconductor has a field-effect mobility of 10 cm$^2$/Vs to 20 cm$^2$/Vs. Since the field-effect mobility of a transistor using an oxide semiconductor is more than or equal to 10 times that of a transistor using amorphous silicon, sufficient performance can be obtained for a switching element of a pixel even in a large-sized display device.

However, there has been a limit to the use of a transistor using an oxide semiconductor as a driver device of a semiconductor device, for example, one switching element of a driver circuit of a large-sized display device or the like.

An object of one embodiment of the present invention is to manufacture a transistor which can be formed over a larger substrate, includes an oxide semiconductor layer with excellent crystallinity to have a desirably high field-effect mobility, in order to realize commercialization of a large-sized display device, a semiconductor device with high performance, or the like.

As a method for increasing the field-effect mobility of a transistor, an oxide semiconductor layer is crystallized. Annealing is performed after a first oxide semiconductor layer is formed, and a second oxide semiconductor layer is formed thereover. And then, crystal growth is caused from the film surface toward a surface of the second oxide semiconductor layer formed above. A crystal in a first crystal layer corresponds to a seed crystal for the second oxide semiconductor layer. It is important to form a second crystal layer thereover. This method for forming the first crystal layer and the second crystal layer is effective for all oxide semiconductors having hexagonal crystals. Note that the first crystal layer and the second crystal layer have plate-like crystals (also referred to as Co-growing (CG) crystals). They are non-single-crystals in which a-axis and b-axis of each crystal are aligned in a channel formation region and in which c-axis of each crystal is aligned perpendicularly to the surface of the first oxide semiconductor layer.

As another method for increasing the field-effect mobility of a transistor, an oxide semiconductor layer is highly purified in the same step as or in a step different from a crystallization step. Specifically, the oxide semiconductor layer is highly purified by removing water or hydrogen which forms a donor level, reducing oxygen deficiency, and then sufficiently supplying oxygen that is a main component of the oxide semiconductor layer.

As a method for supplying oxygen to an oxide semiconductor layer, a formation of an oxide insulating layer in contact with the oxide semiconductor layer or heat treatment after formation of an oxide insulating layer is given.

Then, after oxygen is supplied to the oxide semiconductor layer, a nitride insulating layer containing hydrogen is formed as an interlayer film formed above the oxide semiconductor layer. Hydrogen is diffused from the nitride insulating film into an interface of the oxide semiconductor layer (specifically, an interface with the oxide semiconductor layer) or the film by heating, so that characteristics are improved. In a case where a silicon oxide layer (SiOx layer) is used for the oxide semiconductor layer, by heating, hydrogen diffused from the nitride insulating film terminate dangling bonds of Si at an interface between the oxide semiconductor layer and the SiOx layer, dangling bonds of oxygen or the like in the oxide semiconductor, or the like. According to one embodiment of the present invention, an appropriate amount of hydrogen is intentionally added to an oxide semiconductor layer which has been c-axis-aligned by crystallization to eliminate an interface state. Note that in this specification, "containing hydrogen" means containing more hydrogen than an insulating layer in contact with an oxide semiconductor layer. For example, the hydrogen concentration in the film is higher than or equal to 1×10$^{21}$ atoms/cm$^3$, preferably higher than or equal to 1×10$^{22}$ atoms/cm$^3$, more preferably higher than or equal to 1×10$^{23}$ atoms/cm$^3$.

According to one embodiment of the present invention disclosed in this specification, a method for manufacturing a semiconductor device includes the steps of forming a first oxide semiconductor layer over a substrate having an insulating surface; performing first heat treatment to cause crystal growth from a surface of the first oxide semiconductor layer toward the inside, so that a crystal region in which c-axis is aligned in a direction substantially perpendicular to the surface is formed; forming a second oxide semiconductor layer over the first oxide semiconductor layer; performing second heat treatment to crystallize at least part of the second oxide semiconductor layer by causing crystal growth from the crystal region; forming a conductive layer over the second oxide semiconductor layer; forming a source electrode layer and a drain electrode layer by etching the conductive layer; forming an oxide insulating layer to cover the second oxide semiconductor layer, the source electrode layer, and the drain electrode layer; performing third heat treatment to supply oxygen to the second oxide semiconductor layer; forming a gate electrode layer over the oxide insulating layer in a region overlapped with the second oxide semiconductor layer; forming a nitride insulating layer containing hydrogen over the oxide insulating layer and the gate electrode layer; and performing fourth heat treatment to supply hydrogen at least to an interface between the second oxide semiconductor layer and the oxide insulating layer.

Further, a structure obtained by the above method is also one embodiment of the present invention. A semiconductor device with the structure includes a first oxide semiconductor layer which is c-axis-aligned in a direction perpendicular to a surface of the first oxide semiconductor layer over a substrate having an insulating surface; a second oxide semiconductor layer which is over and in contact with the first oxide semiconductor layer and which is c-axis-aligned in a direction perpendicular to the surface; a source electrode layer and a drain electrode layer over a stack of the first oxide semiconductor layer and the second oxide semiconductor layer; an oxide insulating layer over and in contact with the second oxide semiconductor layer; a gate electrode layer over the oxide insulating layer; and a nitride insulating layer containing hydrogen over the gate electrode layer.

According to another embodiment of the present invention, a method for manufacturing a semiconductor device includes the steps of forming a gate electrode layer over a substrate having an insulating surface; forming a first oxide insulating layer to cover the gate electrode layer; forming a first oxide semiconductor layer over the gate electrode layer and the first oxide insulating layer; performing first heat treatment to cause crystal growth from a surface of the first oxide semiconductor layer toward the inside, so that a crystal region in which c-axis is aligned in a direction substantially perpendicular to the surface is formed; forming a second oxide semiconductor layer over the first oxide semiconductor layer; performing second heat treatment to crystallize at least part of the second oxide semiconductor layer by causing crystal growth from the crystal region; forming a conductive layer over the second oxide semiconductor layer; forming a source electrode layer and a drain electrode layer by etching the conductive layer; forming a second oxide insulating layer to cover the second oxide semiconductor layer, the source electrode layer, and the drain electrode layer; performing third heat treatment to supply oxygen to the second oxide semiconductor layer; forming a nitride insulating layer containing hydrogen over the second oxide insulating layer; and performing fourth heat treatment to supply hydrogen at least to an interface between the first oxide semiconductor layer and the first oxide insulating layer.

Further, a structure obtained by the above method is also one embodiment of the present invention. A semiconductor device with the structure includes a gate electrode layer having a flat surface over a substrate having an insulating surface; a gate insulating layer over the gate electrode layer; a first oxide semiconductor layer which is over the gate insulating layer and in contact with at least part of the gate insulating layer and which is c-axis-aligned in a direction perpendicular to a surface; a second oxide semiconductor layer which is over and in contact with the first oxide semiconductor layer and which is c-axis-aligned in a direction perpendicular to a surface; a source electrode layer and a drain electrode layer over a stack of the first oxide semiconductor layer and the second oxide semiconductor layer; an oxide insulating layer over and in contact with the second oxide semiconductor layer; and a nitride insulating layer containing hydrogen over and in contact with the oxide insulating layer.

When the field-effect mobility of a transistor can be increased with any of the above manufacturing methods, for example, display characteristics can be improved by shortening switching time in a display device.

Even when a substrate material serving as a base is any material such as an oxide, a nitride, or metal, a transistor having high field-effect mobility is manufactured and a large-sized display device, a high performance semiconductor device, and the like are realized.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments.

Embodiment 1

In Embodiment 1, a structure and a manufacturing method of a semiconductor device according to one embodiment of the disclosed invention will be described with reference to FIG. 1, FIGS. 2A to 2E, FIGS. 3A to 3D, and FIGS. 4A to 4E.

Figure 1:
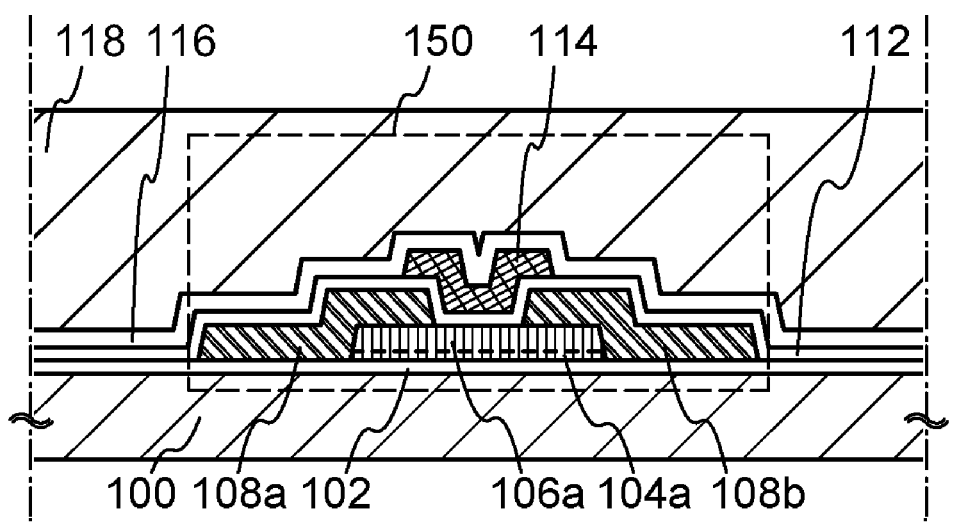
FIG. 1 is a cross-sectional view illustrating one embodiment of the present invention.

FIG. 1 is a cross-sectional view illustrating a transistor 150 which is an example of a structure of a semiconductor device. Note that the transistor 150 is an n-channel insulated gate field effect transistor (IGFET) whose carriers are electrons here; alternatively, a p-channel IGFET can be manufactured.

A manufacturing method of the transistor 150 will be described with reference to FIGS. 2A to 2E and FIGS. 3A to 3D.

First, an insulating layer 102 is formed over a substrate 100. Then, a first oxide semiconductor layer is formed over the insulating layer 102 and a region including at least a surface of the first oxide semiconductor layer is crystallized through first heat treatment, so that a first oxide semiconductor layer 104 is formed (see FIG. 2A).

The substrate 100 may be any substrate that has an insulating surface and may be, for example, a glass substrate. In particular, a large-sized glass substrate is preferable because semiconductor devices according to one embodiment of the present invention can be mass-produced at low cost. The glass substrate is preferably a non-alkali glass substrate. As a material of the non-alkali glass substrate, a glass material such as aluminosilicate glass, aluminoborosilicate glass, or barium borosilicate glass is used, for example. Alternatively, as the substrate 100, an insulating substrate formed using an insulator, such as a quartz substrate or a sapphire substrate, a semiconductor substrate which is formed using a semiconductor material such as silicon and has a surface covered with an insulating material, or a conductive substrate which is formed using a conductor such as metal or stainless steel and has a surface covered with an insulating material can be used.

The insulating layer 102 functions as a base and can be formed by a CVD method, a sputtering method, or the like. The insulating layer 102 is preferably formed so as to contain silicon oxide, silicon nitride, silicon oxynitride, silicon nitride oxide, aluminum oxide, hafnium oxide, tantalum oxide, or the like. Note that the insulating layer 102 may have a single-layer structure or a stacked-layer structure. There is no particular limitation on the thickness of the insulating layer 102; the insulating layer 102 can have a thickness of 10 nm to 500 nm inclusive, for example. Note that the insulating layer 102 is not an essential component; therefore, a structure in which the insulating layer 102 is not provided is also possible.

The first oxide semiconductor layer formed over the insulating layer 102 is a three-component metal oxide. An oxide semiconductor material represented by In-$M_X$-$Zn_Y$—$O_Z$ (Y=0.5 to 5) may be used. Here, M represents one or more kinds of elements selected from Group 13 elements such as gallium (Ga), aluminum (Al), and boron (B). Note that values of an In content, an M content, a Zn content, and an O content are arbitrary. The value of the M content may be 0 (that is, X=0). On the other hand, the values of the In content and the Zn content are not 0. In other words, the above expression may represent In—Ga—Zn—O, In—Zn—O, and the like.

As the first oxide semiconductor layer, any of the following materials can be used: a four-component metal oxide such as In—Sn—Ga—Zn—O; three-component metal oxides such as In—Sn—Zn—O, Sn—Ga—Zn—O, Al—Ga—Zn—O, and Sn—Al—Zn—O; two-component metal oxides such as Sn—Zn—O, Al—Zn—O, Zn—Mg—O, Sn—Mg—O, and In—Mg—O; single-component metal oxides such as In—O, Sn—O, and Zn—O; and the like.

In Embodiment 1, the first oxide semiconductor layer is formed by a sputtering method using a target for depositing an In—Ga—Zn—O-based oxide semiconductor.

As a target used for forming the first oxide semiconductor layer by a sputtering method, a target for depositing an oxide semiconductor containing zinc oxide as its main component can be used, for example. Moreover, the composition ratio of In:Ga:Zn of a target for depositing an oxide semiconductor containing In, Ga, and Zn is 1:x:y (x is greater than or equal to 0, and y is greater than or equal to 0.5 and less than or equal to 5). For example, a target whose composition ratio of In:Ga:Zn is 1:1:1 [atomic ratio] (x=1, y=1) (that is, $In_2O_3$:$Ga_2O_3$:ZnO=1:1:2 [molar ratio]) or the like may be used. Further, as a target for depositing the oxide semiconductor, a target whose composition ratio of In:Ga:Zn is 1:1:0.5 [atomic ratio], a target whose composition ratio of In:Ga:Zn is 1:1:2 [atomic ratio], or a target whose composition ratio of In:Ga:Zn is 1:0:1 [atomic ratio] (x=0, y=1) can be used. In Embodiment 1, since the first oxide semiconductor layer is intentionally crystallized by performing heat treatment in a later step, a target for depositing an oxide semiconductor in which crystallization is easily caused is preferably used.

An oxide semiconductor contained in the target for depositing an oxide semiconductor has a relative density of 80% or more, preferably 95% or more, more preferably 99.9% or more. A dense first oxide semiconductor layer is formed using a target for depositing an oxide semiconductor with a high relative density. Further, in Embodiment 1, since the first oxide semiconductor layer is intentionally crystallized by performing heat treatment in a later step, a target for depositing an oxide semiconductor in which crystallization is easily caused is preferably used.

The atmosphere in which the first oxide semiconductor layer is formed is preferably a rare gas (typically, argon) atmosphere, an oxygen atmosphere, or a mixed atmosphere of a rare gas (typically, argon) and oxygen. Specifically, a high-purity gas atmosphere is preferable in which the concentration of impurities such as hydrogen, water, a hydroxyl group, and hydride is reduced to approximately several parts per million (preferably several parts per billion).

In forming the first oxide semiconductor layer, for example, the substrate is held in a treatment chamber that is kept in a reduced pressure state, and the substrate is heated to a temperature of 100° C. to 600° C. inclusive, preferably 200° C. to 400° C. inclusive. Then, a sputtering gas from which hydrogen and water are removed is introduced into the treatment chamber from which remaining moisture is removed, and the first oxide semiconductor layer is formed using a metal oxide as a target. By forming the first oxide semiconductor layer while heating the substrate, impurities in the first oxide semiconductor layer can be decreased. Moreover, damage due to sputtering is reduced. Moisture and the like which remain in the sputtering apparatus are preferably removed before, during, or after the formation of the first oxide semiconductor layer. In order to remove moisture remaining in the treatment chamber, an entrapment vacuum pump is preferably used. For example, a cryopump, an ion pump, a titanium sublimation pump, or the like can be used. A turbo pump provided with a cold trap may be used. From the treatment chamber evacuated with a cryopump, hydrogen, water, or the like is removed; thus, the impurity concentration of the first oxide semiconductor layer can be reduced.

Note that preheat treatment is preferably performed before the formation of the first oxide semiconductor layer in order to remove moisture and the like which remain in the sputtering apparatus. As the preheat treatment, a method in which the inside of the film formation chamber is heated to higher than or equal to 200° C. and lower than or equal to 600° C. under reduced pressure, a method in which introduction and exhaust of nitrogen or an inert gas are repeated while the inside of the film formation chamber is heated, and the like can be given. After the preheat treatment, the substrate or the sputtering apparatus is cooled. Then, an oxide semiconductor layer is formed without exposure to the air. In this case, not water but oil or the like is preferably used as a coolant for the target. Although a certain level of effect can be obtained when introduction and exhaust of nitrogen are repeated without heating, it is more preferable to perform the treatment with the inside of the film formation chamber heated.

For example, the first oxide semiconductor layer can be formed under the following conditions: the distance between the substrate and the target is 170 mm, the pressure is 0.4 Pa, the direct current (DC) power is 0.5 kW, and the atmosphere is an oxygen atmosphere (the proportion of the oxygen flow is 100%). Note that a pulsed direct current (DC) power source is preferably used because powder substances (also referred to as particles or dust) generated in film formation can be reduced and thickness distribution can be small. The thickness of the first oxide semiconductor layer is set in the range of 3 nm to 15 nm, and in Embodiment 1, is set to 5 nm as an example. Note that the appropriate thickness of the first oxide semiconductor layer depends on the oxide semiconductor material to be used, the intended use, or the like; therefore, the thickness may be determined as appropriate in accordance with the material, the intended use, or the like.

Further, as crystallization of the first oxide semiconductor layer, the first heat treatment is performed to crystallize at least a region including a surface of the first oxide semiconductor layer, whereby the first oxide semiconductor layer 104 is formed. Furthermore, water (including a hydroxyl group), hydrogen, or the like contained in the first oxide semiconductor layer can be removed by the first heat treatment. The temperature of the first heat treatment is set in the range of 450° C. to 850° C., preferably 550° C. to 750° C. Heating time is greater than or equal to 1 minute and less than or equal to 24 hours. In Embodiment 1, after dehydration or dehydrogenation is performed by heat treatment at 700° C. in a nitrogen atmosphere for 1 hour as the first heat treatment, the atmosphere is switched to an oxygen atmosphere, so that oxygen is supplied to the inside of the first oxide semiconductor layer.

Note that in the first heat treatment, it is preferable that water, hydrogen, and the like be not contained in nitrogen, oxygen, or a rare gas such as helium, neon, or argon. Alternatively, it is preferable that nitrogen, oxygen, or a rare gas such as helium, neon, or argon introduced into a heat treatment apparatus have purity of 6N (99.9999%) or more, preferably, 7N (99.99999%) or more (that is, an impurity concentration be set to 1 ppm or lower, preferably, 0.1 ppm or lower). Further, the first heat treatment may be performed in dry air with an $H_2O$ concentration of 20 ppm or lower, preferably in dry air with an $H_2O$ concentration of 1 ppm or lower. Water (including a hydroxyl group), hydrogen, or the like contained in the first oxide semiconductor layer 104 can be removed by such first heat treatment.

By the first heat treatment, the first oxide semiconductor layer 104 including a crystal region is formed at least in a region including a surface. The crystal region formed in the region including the surface is formed by crystal growth from the surface toward the inside. The crystal region includes plate-like crystals whose average thickness is greater than or equal to 2 nm and less than or equal to 10 nm. The crystal region is a region including a crystal whose c-axis is aligned in a direction substantially perpendicular to the surface. Here, "substantially perpendicular" means a state within ±10° from a perpendicular direction.

There is no particular limitation on the heat treatment apparatus used for the first heat treatment and an apparatus for heating an object to be processed by thermal conduction or thermal radiation from a heater such as a resistance heater can be used. For example, an electric furnace, or a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas.

Figure 2A:
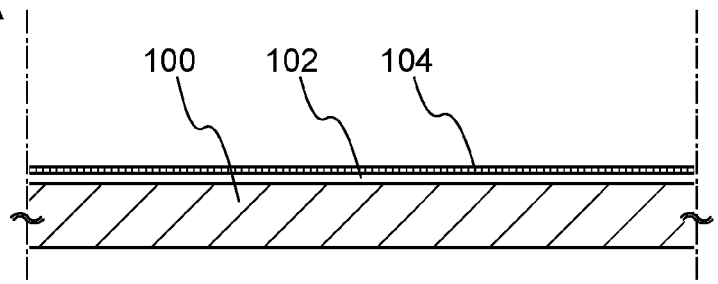
FIGS. 2A to 2E are cross-sectional process views illustrating one embodiment of the present invention.
Figure 2B:
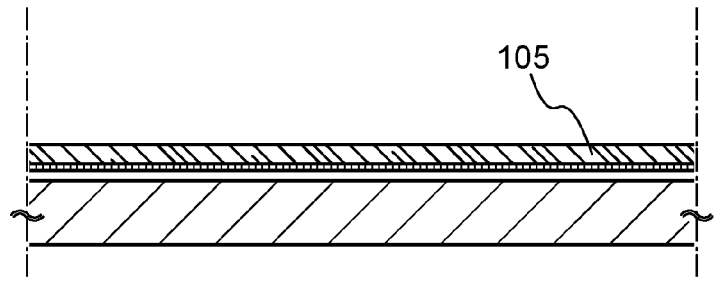

Next, a second oxide semiconductor layer 105 is formed over the first oxide semiconductor layer 104 including the crystal region at least in the region including the surface (see FIG. 2B).

Similarly to the first oxide semiconductor layer, the second oxide semiconductor layer 105 can be formed using any of the following materials: a four-component metal oxide such as In—Sn—Ga—Zn—O; three-component metal oxides such as In—Ga—Zn—O, In—Sn—Zn—O, In—Al—Zn—O, Sn—Ga—Zn—O, Al—Ga—Zn—O, and Sn—Al—Zn—O; two-component metal oxides such as In—Zn—O, Sn—Zn—O, Al—Zn—O, Zn—Mg—O, Sn—Mg—O, and In—Mg—O; single-component metal oxides such as In—O, Sn—O, and Zn—O; and the like.

Note that it is preferable that the second oxide semiconductor layer 105 be formed using a material containing the same main component as the first oxide semiconductor layer 104 or have the same crystal structure as the first oxide semiconductor layer 104 and lattice constants close to those of the first oxide semiconductor layer 104 (lattice mismatch is less than or equal to 1%). Alternatively, a material containing different main component may be used.

In the case where the material containing the same main component is used, crystal growth is easily caused using a crystal in the crystal region of the first oxide semiconductor layer 104 as a seed crystal in crystallization of the second oxide semiconductor layer 105, which is to be performed later. Further, the practical thickness can be increased, which is favorable for the use for a power device or the like. Furthermore, in the case where the material containing the same main component is used, physical properties of an interface, such as adhesion, or electrical characteristics are favorable.

In Embodiment 1, the second oxide semiconductor layer 105 is formed by a sputtering method with the use of an In—Ga—Zn—O-based target for depositing an oxide semiconductor. The second oxide semiconductor layer 105 may be formed by a sputtering method in a manner similar to that of the first oxide semiconductor layer. However, the thickness of the second oxide semiconductor layer 105 is preferably larger than that of the first oxide semiconductor layer 104. In addition, the second oxide semiconductor layer 105 is preferably formed so that the total thickness of the first oxide semiconductor layer 104 and the second oxide semiconductor layer 105 is greater than or equal to 3 nm and less than or equal to 50 nm Note that the appropriate thickness of the second oxide semiconductor layer 105 depends on the oxide semiconductor material to be used, the intended use, or the like; therefore, the thickness may be determined as appropriate in accordance with the material, the intended use, or the like.

Figure 2C:
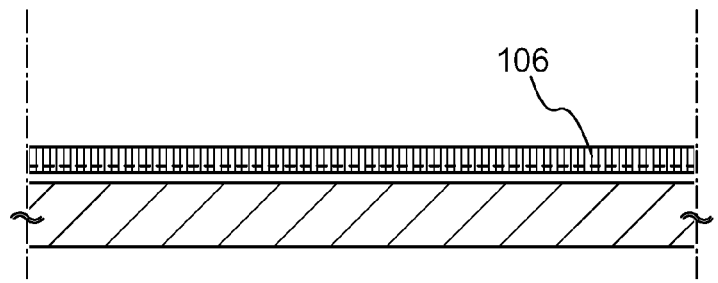

Next, by performing second heat treatment on the second oxide semiconductor layer 105, crystal growth is caused using the crystal region of the first oxide semiconductor layer 104 as a seed crystal region, so that a second oxide semiconductor layer 106 is formed (see FIG. 2C).

The temperature of the second heat treatment is higher than or equal to 450° C. and lower than or equal to 850° C., preferably higher than or equal to 600° C. and lower than or equal to 700° C. Heating time of the second heat treatment is greater than or equal to 1 minute and less than or equal to 100 hours, preferably greater than or equal to 5 hours and less than or equal to 20 hours, typically 10 hours.

Note that also in the second heat treatment, it is preferable that water, hydrogen, and the like be not contained in nitrogen, oxygen, or a rare gas such as helium, neon, or argon. Alternatively, it is preferable that nitrogen, oxygen, or a rare gas such as helium, neon, or argon introduced into a heat treatment apparatus have purity of 6N (99.9999%) or more, preferably, 7N (99.99999%) or more. Further, the second heat treatment may be performed in dry air with an $H_2O$ concentration of 20 ppm or lower, preferably in dry air with an $H_2O$ concentration of 1 ppm or lower. Water (including a hydroxyl group), hydrogen, or the like contained in the second oxide semiconductor layer 106 can be removed by such second heat treatment. Thus, the first oxide semiconductor layer 104 and the second oxide semiconductor layer 106 which are highly purified by reduction of impurities and made to be i-type or substantially i-type oxide semiconductor layers can be formed.

In addition, at the time of increasing the temperature in the second heat treatment, the inside of a furnace may set to a nitrogen atmosphere and the inside of the furnace may be switched to an oxygen atmosphere at the time of performing cooling. The inside portion of the second oxide semiconductor layer 106 can be supplied with oxygen by changing the nitrogen atmosphere to the oxygen atmosphere after the dehydration or dehydrogenation is performed in the nitrogen atmosphere.

In this manner, by the second heat treatment, the whole second oxide semiconductor layer 105 is crystallized from the crystal region formed at an interface between the second oxide semiconductor layer 105 and the first oxide semiconductor layer 104, whereby the second oxide semiconductor layer 106 can be formed. Moreover, by the second heat treatment, the first oxide semiconductor layer 104 including a crystal layer having higher orientation can be obtained.

For the above oxide semiconductor layers, a thin film represented by $InMO_3(ZnO)_m$ (m>0 and m is not a natural number) can be used. Here, M represents one or more metal elements selected from Ga, Al, Mn, and Co. For example, M can be Ga, Ga and Al, Ga and Mn, Ga and Co, or the like. Alternatively, a material represented by $InGa_xZn_yO_z$ can be used. Here, x, y, and z are arbitrary numbers. In addition, x, y, and z are not necessarily integers and may be non-integers. Note that x may be 0; however, y is preferably not 0. For example, the representation includes a crystal of In—Zn—O in which x is 0. A crystal represented by In—Ga—Zn—O in this specification is $InGaO_3(ZnO)_m$ (m>0, and m is not a natural number), and it can be confirmed using analysis with ICP-MS or RBS that m is not a natural number. In addition, a crystal in which x and y both are 1, a crystal in which x is 1 and y is 0.5, and the like are included. Such a crystal is aligned by the second heat treatment so that the c-axis is substantially perpendicular to a surface of the second oxide semiconductor layer 106.

Here, the above crystals include any of In, Ga, and Zn, and can be considered to have a stacked-layer structure of layers parallel to a-axis and b-axis. Specifically, the above crystals have a structure in which a layer containing In and a layer without In (a layer containing Ga or Zn) are stacked in a c-axis direction.

In In—Ga—Zn—O-based oxide semiconductor crystals, conductivity of a layer containing In in a direction parallel to a-axis and b-axis is favorable. This is because electrical conductivity of the In—Ga—Zn—O-based oxide semiconductor crystals is controlled mainly by In and a 5s orbital of one In overlaps with a 5s orbital of an adjacent In, so that a carrier path is formed.

In the case where a structure is employed in which the first oxide semiconductor layer 104 includes an amorphous region at an interface with the insulating layer 102, by the second heat treatment, crystal growth is caused from the crystal region formed on the surface of the first oxide semiconductor layer 104 toward an under surface of the first oxide semiconductor layer 104 and the amorphous region is crystallized in some cases. Note that the amorphous region is left in some cases, depending on a material of the insulating layer 102 or conditions of heat treatment.

In the case where the material containing the same main component is used for the first oxide semiconductor layer 104 and the second oxide semiconductor layer 105, as illustrated in FIG. 2C, crystal growth is caused toward the surface of the second oxide semiconductor layer 105 using a crystal in the first oxide semiconductor layer 104 as a seed crystal, so that the second oxide semiconductor layer 106 is formed. The first oxide semiconductor layer 104 and the second oxide semiconductor layer 106 have the same crystal structure. Therefore, the boundary between the first oxide semiconductor layer 104 and the second oxide semiconductor layer 106 is shown by a dashed line in FIG. 2C; however, the boundary between the first oxide semiconductor layer 104 and the second oxide semiconductor layer 106 cannot be determined and the first oxide semiconductor layer 104 and the second oxide semiconductor layer 106 can be regarded to as one layer in some cases.

Note that the heat treatment apparatus used for the second heat treatment can be used under conditions similar to those of the first heat treatment.

Figure 2D:
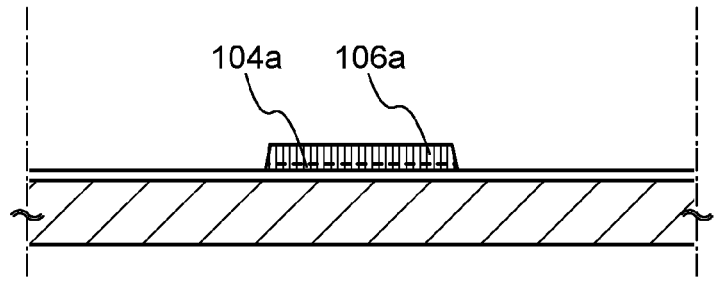

Next, the first oxide semiconductor layer 104 and the second oxide semiconductor layer 106 are processed by a method such as etching with the use of a mask, whereby an island-shaped first oxide semiconductor layer 104a and an island-shaped second oxide semiconductor layer 106a are formed (see FIG. 2D).

As a method for etching the oxide semiconductor layers, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layers can be etched into a desired shape.

Examples of an etching gas which can be used for dry etching are a gas containing chlorine (a chlorine-based gas such as chlorine ($Cl_2$), boron chloride ($BCl_3$), silicon tetrachloride ($SiCl_4$), or carbon tetrachloride ($CCl_4$)) and the like. Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As an etchant which can be used for wet etching, a mixed solution of phosphoric acid, acetic acid, and nitric acid, or the like can be used. An etchant such as ITO07N (produced by KANTO CHEMICAL CO., INC.) may also be used.

Figure 2E:
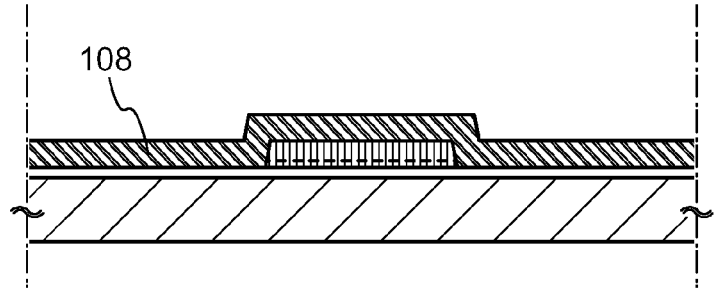

Next, a conductive layer 108 is formed so as to be in contact with the island-shaped second oxide semiconductor layer 106a (see FIG. 2E).

The conductive layer 108 can be formed by a PVD method such as a sputtering method, or a CVD method such as a plasma CVD method. The conductive layer 108 can be formed using an element selected from aluminum, chromium, copper, tantalum, titanium, molybdenum, and tungsten, an alloy containing any of these elements as a component, or the like. A material containing one or more of manganese, magnesium, zirconium, and beryllium, may be used for the conductive layer 108. A material containing aluminum and one or more of elements selected from titanium, tantalum, tungsten, molybdenum, chromium, neodymium, and scandium may be used. As another material of the conductive layer 108, a material having a high barrier property, such as titanium nitride or tantalum nitride, may be used. When a material having a high barrier property, such as titanium nitride or tantalum nitride, is used for a portion of the conductive layer 108 in contact with the island-shaped second oxide semiconductor layer 106a, entry of an impurity into the island-shaped second oxide semiconductor layer 106a can be suppressed and an adverse effect on transistor characteristics can be suppressed.

The conductive layer 108 may also be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer 108 preferably has a three-layer structure in which a titanium layer, an aluminum layer, and a titanium layer are stacked in this order. Alternatively, a metal conductive film can have a two-layer structure in which an aluminum layer and a tungsten layer are stacked, a two-layer structure in which a copper layer and a tungsten layer are stacked, or a two-layer structure in which an aluminum layer and a molybdenum layer are stacked. Needless to say, the metal conductive film may have a single-layer structure or a stacked-layer structure including four or more layers. Here, a single-layer structure of a titanium film is employed. When a single-layer structure of a titanium film is employed, etching by which a favorable tapered shape is formed can be performed later.

Figure 3A:
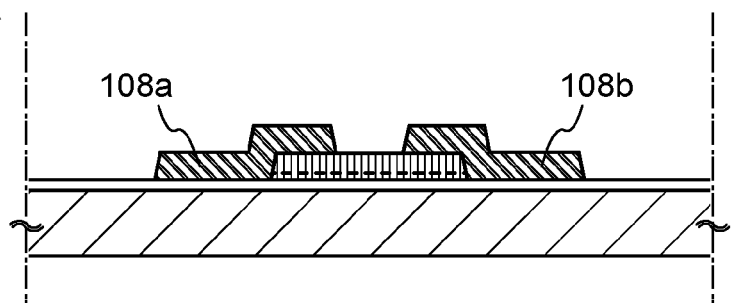
FIGS. 3A to 3D are cross-sectional process views illustrating one embodiment of the present invention.

Next, the conductive layer 108 is selectively etched to form a source electrode layer 108a and a drain electrode layer 108b (see FIG. 3A).

Here, ultraviolet rays, a KrF laser beam, or an ArF laser beam is preferably used for exposure for forming an etching mask. Particularly for light exposure in the case where the channel length (L) is less than 25 nm, light exposure for forming a mask is preferably performed with extreme ultraviolet light whose wavelength is several nanometers to several tens of nanometers, which is extremely short. Light exposure with extreme ultraviolet leads to a high resolution and a large depth of focus. Therefore, the channel length (L) of a transistor, which is formed later, can also be 10 nm to 1000 nm (1 µm) inclusive. By a decrease in channel length by such a method, operation speed can be improved. In addition, the off-state current of a transistor including the above-described oxide semiconductor is extremely low; thus, an increase in power consumption due to miniaturization of the transistor can be suppressed.

The materials and etching conditions of the conductive layer 108 and the island-shaped second oxide semiconductor layer 106a are adjusted as appropriate so that the island-shaped second oxide semiconductor layer 106a is not removed in etching of the conductive layer 108. Note that the island-shaped second oxide semiconductor layer 106a is partly etched in the etching step and thus has a groove portion (a recessed portion) in some cases depending on the materials and the etching conditions.

There is a case where portions in contact with the source electrode layer 108a or the drain electrode layer 108b are in an amorphous state in the vicinity of side surfaces of the island-shaped first oxide semiconductor layer 104a and the island-shaped second oxide semiconductor layer 106a.

Figure 3B:
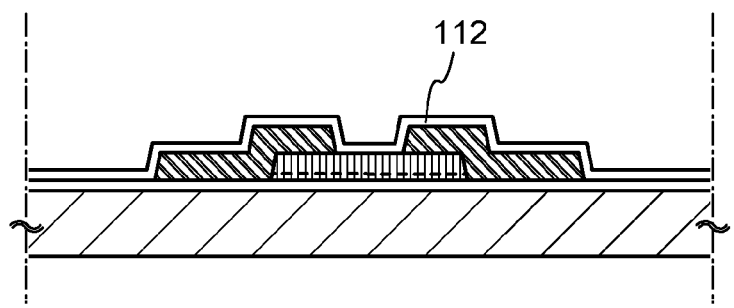

Next, a gate insulating layer 112 is formed in contact with part of the island-shaped second oxide semiconductor layer 106a without exposure to the air (see FIG. 3B). The gate insulating layer 112 can be formed by a CVD method, a sputtering method, or the like. The gate insulating layer 112 is preferably formed so as to include silicon oxide, silicon oxynitride, silicon nitride oxide, aluminum oxide, hafnium oxide, tantalum oxide, or the like. Note that the gate insulating layer 112 may have a single-layer structure or a stacked-layer structure. In the case where a stacked-layer structure is employed, any of the above materials is used for a layer in contact with an oxide semiconductor and a silicon nitride film can be stacked thereover. There is no particular limitation on the thickness of the gate insulating layer 112; the gate insulating layer 112 can have a thickness of, for example, 10 nm to 500 nm, preferably 50 nm 200 nm.

In Embodiment 1, a silicon oxide film is formed by a sputtering method in an oxygen atmosphere to form the gate insulating layer 112. Oxygen can be supplied to the island-shaped second oxide semiconductor layer 106a by adding oxygen to part of the island-shaped second oxide semiconductor layer 106a at the time of the formation of the gate insulating layer 112.

Further, as the gate insulating layer 112, a dense and high-quality gate insulating layer having high withstand voltage may be formed with a high-density plasma apparatus which can realize a plasma density higher than or equal to $1 \times 10^{11}$/cm$^3$.

After that, third heat treatment is preferably performed in an inert gas atmosphere or an oxygen atmosphere. The temperature of the third heat treatment is set in the range of 200° C. to 450° C., preferably 250° C. to 350° C. For example, the heat treatment may be performed at 250° C. for 1 hour in an atmosphere containing oxygen. By the third heat treatment, oxygen is supplied to the island-shaped second oxide semiconductor layer 106a and oxygen deficiency in the island-shaped second oxide semiconductor layer 106a can be reduced.

Figure 3C:
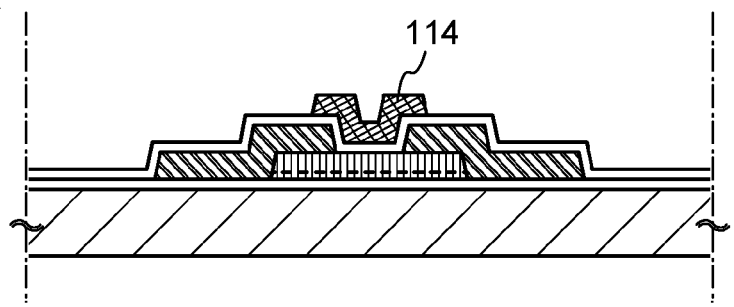

Next, a gate electrode layer 114 is formed over the gate insulating layer 112 in a region overlapped with the island-shaped first oxide semiconductor layer 104a and the island-shaped second oxide semiconductor layer 106a (see FIG. 3C). The gate electrode layer 114 can be formed by forming a conductive layer over the gate insulating layer 112 and then selectively patterning the conductive layer.

The conductive layer can be formed by a PVD method such as a sputtering method, or a CVD method such as a plasma CVD method. The conductive layer can be formed using an element selected from aluminum, chromium, copper, tantalum, titanium, molybdenum, and tungsten, an alloy containing any of these elements as a component, or the like. Alternatively, the conductive layer may be formed using titanium nitride, tantalum nitride, or the like which is a nitride containing any of the above elements. A material containing one or more of manganese, magnesium, zirconium, and beryllium may be used. A material containing aluminum and one or more of elements selected from titanium, tantalum, tungsten, molybdenum, chromium, neodymium, and scandium may be used.

Figure 3D:
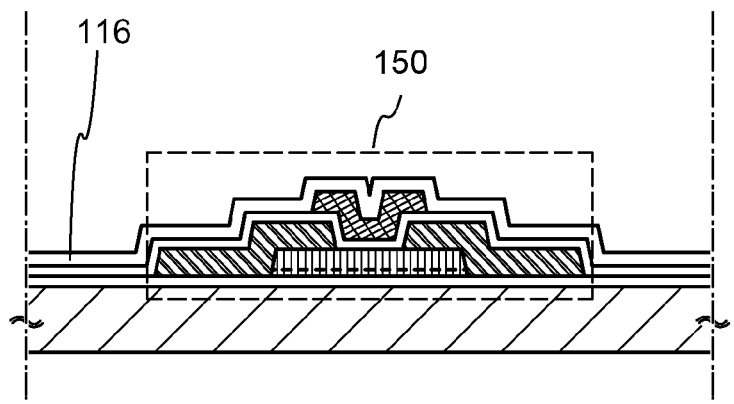

Then, after an interlayer insulating layer 116 containing hydrogen is formed over the gate insulating layer 112 and the gate electrode layer 114, fourth heat treatment is performed (see FIG. 3D). The interlayer insulating layer 116 containing hydrogen can be formed by a CVD method or the like. In Embodiment 1, a nitride silicon film which is one of nitride insulating layers obtained by a CVD method is used.

The fourth heat treatment is performed in a nitrogen atmosphere at higher than or equal to 150° C. and lower than or equal to 450° C., preferably higher than or equal to 250° C. and lower than or equal to 440° C. In addition, the fourth heat treatment may be performed in an oxygen atmosphere, a rare gas atmosphere, or a dry air atmosphere without limitation on a nitrogen atmosphere.

The fourth heat treatment after the interlayer insulating layer 116 containing hydrogen is formed is a step in which hydrogen contained in the interlayer insulating layer 116 is diffused to terminate defects of the island-shaped first oxide semiconductor layer 104a and the island-shaped second oxide semiconductor layer 106a (e.g., dangling bonds of oxygen or the like in an oxide semiconductor) and dangling bonds of Si at an interface. Hydrogen can be diffused into the island-shaped first oxide semiconductor layer 104a and the island-shaped second oxide semiconductor layer 106a or the interface between these oxide semiconductor layers and SiOx layer (the gate insulating layer 112) regardless of existence of the insulating film (the gate insulating layer 112) formed of a silicon oxide film.

As described above, a transistor 150 which includes the island-shaped second oxide semiconductor layer 106a formed by crystal growth from the crystal region of the island-shaped first oxide semiconductor layer 104a and in which defects are terminated by diffusing hydrogen contained in the interlayer insulating layer 116 is completed.

Then, an interlayer insulating layer 118 is formed over the interlayer insulating layer 116. A cross-sectional structure at this stage is illustrated in FIG. 1. The interlayer insulating layer 118 is formed using a material containing an inorganic insulating material such as silicon oxide, silicon nitride oxide, silicon nitride, hafnium oxide, aluminum oxide, or tantalum oxide which is obtained by a PVD method, a CVD method, or the like. Alternatively, an organic resin such as polyimide, acrylic, benzocyclobutene, polyamide, or epoxy can be used for a material of the interlayer insulating layer 118. Note that a stacked-layer structure of the interlayer insulating layers 116 and 118 is used in Embodiment 1, but one embodiment of the disclosed invention is not limited to this example. A single-layer structure or a stacked-layer structure including three or more layers may be used.

Note that the interlayer insulating layer 118 is desirably formed so as to have a flat surface. This is because an electrode, a wiring, or the like can be favorably formed over the interlayer insulating layer 118 when the interlayer insulating layer 118 is formed so as to have a flat surface.

The transistor 150 illustrated in FIG. 1 includes the island-shaped first oxide semiconductor layer 104a provided over the substrate 100 with the insulating layer 102 therebetween; the island-shaped second oxide semiconductor layer 106a provided over the island-shaped first oxide semiconductor layer 104a; the source electrode layer 108a and the drain electrode layer 108b which are electrically connected to the island-shaped second oxide semiconductor layer 106a; the gate insulating layer 112 covering the island-shaped second oxide semiconductor layer 106a, the source electrode layer 108a, and the drain electrode layer 108b; and the gate electrode layer 114 over the gate insulating layer 112.

In the island-shaped first oxide semiconductor layer 104a and the island-shaped second oxide semiconductor layer 106a, the carrier concentration is sufficiently low (e.g., lower than $1 \times 10^{12}/cm^3$, preferably lower than $1.45 \times 10^{10}/cm^3$) as compared with the carrier concentration (approximately $1 \times 10^{14}/cm^3$) of a general silicon wafer. In the case where a drain voltage is in the range of 1 V to 10 V, a channel length is 10 lam and the total thickness of the oxide semiconductor layers is 30 nm, an off-state current (current flowing between a source and a drain when a voltage between a gate and the source is 0 V or less) can be $1 \times 10^{-13}$ A or less, or the off-state current density (a value obtained by dividing the off-state current by the channel width of the transistor) can be 100 aA/μm or less, preferably 10 aA/μm or less, more preferably 1 aA/μm or less (a (atto) means $10^{-18}$ times). Note that the resistance at the time when the transistor is off (off-state resistance R) can be calculated using Ohm's law if the values of the off-state current and the drain voltage are obtained, and the off-state resistivity ρ can be calculated using the formula $ρ=RA/L$ (R is the off-state resistance) if the cross-sectional area A of the channel formation region and the channel length L are obtained. It is preferable that the off-state resistivity be greater than or equal to $1 \times 10^9$ Ω·m (or $1 \times 10^{10}$ Ω·m). Here, the cross-sectional area A can be calculated from the formula $A=dW$ when the thickness of the channel formation region is d and the channel width is W.

Since hydrogen contained in the interlayer insulating layer 116 is diffused into the island-shaped first oxide semiconductor layer 104a and the island-shaped second oxide semiconductor layer 106a by heating, the carrier concentration can be higher than or equal to $1 \times 10^{14}/cm^3$ and lower than $1 \times 10^{18}/cm^3$.

The off-state current of a transistor using amorphous silicon is approximately $1 \times 10^{-12}$ A, whereas the off-state current of a transistor using an oxide semiconductor is 1/10000 or less of the off-state current of a transistor of amorphous silicon. The transistor 150 with extremely excellent off-state current characteristics can be obtained with the use of such an i-type or substantially i-type oxide semiconductor.

In the case where the island-shaped first oxide semiconductor layer 104a and the island-shaped second oxide semiconductor layer 106a are formed using the same material (that is, in the case of homoepitaxial growth), the boundary between the island-shaped first oxide semiconductor layer 104a and the island-shaped second oxide semiconductor layer 106a is shown by a dashed line in FIG. 1 because the boundary cannot be determined; however, the island-shaped first oxide semiconductor layer 104a and the island-shaped second oxide semiconductor layer 106a can be regarded to as one layer in some cases (see FIG. 1). In addition, both the island-shaped first oxide semiconductor layer 104a and the island-shaped second oxide semiconductor layer 106a become non-single-crystalline state.

Needless to say, the island-shaped first oxide semiconductor layer 104a and the island-shaped second oxide semiconductor layer 106a may be formed using different materials. In the case where the island-shaped first oxide semiconductor layer 104a and the island-shaped second oxide semiconductor layer 106a are formed using different materials (that is, in the case of heteroepitaxial growth), for example, In—Zn—O which is a two-component metal oxide can be used for the island-shaped first oxide semiconductor layer 104a and In—Ga—Zn—O which is a three-component metal oxide can be used for the island-shaped second oxide semiconductor layer 106a.

Further, the channel formation region in the oxide semiconductor layers preferably has at least a flat surface. Furthermore, the first oxide semiconductor layer and the second oxide semiconductor layer include non-single-crystals which are c-axis-aligned. Note that a difference in height of the surface of the second oxide semiconductor layer is preferably 1 nm or less (preferably 0.2 nm or less) in the region overlapped with the gate electrode layer (channel formation region).

Embodiment 2

Although an example of manufacturing a top-gate transistor is described in Embodiment 1, an example of manufacturing a bottom-gate transistor is described in Embodiment 2.

First, a conductive film is formed over a substrate having an insulating surface, and then a gate electrode layer 401 is provided using a photolithography step with the use of a photomask.

As a substrate 400, a substrate of a glass material such as aluminosilicate glass, aluminoborosilicate glass, or barium borosilicate glass, a silicon substrate, a quartz substrate, or the like is used.

In Embodiment 2, a glass substrate is used as the substrate 400, and heat treatment at 650° C. for 6 minutes is performed twice on the substrate 400 because heat treatment is performed later for crystallization of an oxide semiconductor layer which is to be formed. By heating the substrate before the formation, film peeling or misalignment of a mask due to shrink of the substrate can be suppressed.

An insulating layer serving as a base layer may be provided between the substrate 400 and the gate electrode layer 401. The base layer has a function of preventing diffusion of an impurity element from the substrate 400, and can be formed to have a single-layer structure or a stacked-layer structure including one or more of a silicon nitride layer, a silicon oxide layer, a silicon nitride oxide layer, and a silicon oxynitride layer.

A metal conductive layer can be used as the gate electrode layer 401. As the material of the metal conductive layer, an element selected from Al, Cr, Cu, Ta, Ti, Mo, and W; an alloy containing any of these elements as a component; an alloy containing any of these elements in combination; or the like is preferably used. For example, a three-layer structure in which a titanium layer, an aluminum layer, and a titanium layer are stacked in this order is preferably used. It is needless to say that the metal conductive layer may have a single-layer structure, a two-layer structure, or a stacked-layer structure including four or more layers. In the case where heat treatment is performed later, a material that can withstand a temperature of the heat treatment is preferably selected for the gate electrode layer 401.

Next, a gate insulating layer 402 is formed over the gate electrode layer 401. The gate insulating layer 402 can be formed to have a single-layer structure or a stacked-layer structure using a silicon oxide layer, a silicon nitride layer, a hafnium oxide layer, a silicon oxynitride layer, or a silicon nitride oxide layer by a plasma CVD method, a sputtering method, or the like. For example, a stack including a silicon nitride film and a silicon oxide film is used. The film thickness of the gate insulating layer 402 is 50 nm to 200 nm inclusive.

In Embodiment 2, the gate insulating layer 402 is formed using a high-density plasma apparatus. Here, a high-density plasma apparatus refers to an apparatus which can realize a plasma density higher than or equal to $1 \times 10^{11}/cm^3$. For example, plasma is generated by applying a microwave power higher than or equal to 3 kW and lower than or equal to 6 kW so that the insulating film is formed.

A monosilane gas ($SiH_4$), nitrous oxide ($N_2O$), and a rare gas are introduced into a chamber as a source gas to generate high-density plasma at a pressure higher than or equal to 10 Pa and lower than or equal to 30 Pa so that an insulating film is formed over a substrate having an insulating surface, such as a glass substrate. After that, the supply of a monosilane gas ($SiH_4$) is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The insulating film formed through the above process procedure corresponds to an insulating film whose reliability can be ensured even though it has small thickness, for example, a thickness less than 100 nm.

In Embodiment 2, a silicon oxynitride film (also referred to as $SiO_xN_y$, where x>y>0) with a thickness of 100 nm formed using the high-density plasma apparatus is used as the gate insulating layer 402.

Then, a first oxide semiconductor layer is formed to a thickness greater than or equal to 2 nm less than or equal to 15 nm over the gate insulating layer 402. The first oxide semiconductor layer can be formed by a sputtering method in a rare gas (typically, argon) atmosphere, an oxygen atmosphere, or a mixed atmosphere of a rare gas (typically, argon) and oxygen. In Embodiment 2, since crystallization is intentionally caused by performing heat treatment in a later step, it is preferable to use a target for depositing an oxide semiconductor in which crystallization is easily caused.

Then, the first oxide semiconductor layer is subjected to the first heat treatment and at least part of the first oxide semiconductor layer is crystallized. The first heat treatment is performed at a temperature higher than or equal to 450° C. and lower than or equal to 850° C., preferably higher than or equal to 600° C. and lower than or equal to 700° C. Heating time is greater than or equal to 1 minute and less than or equal to 24 hours. By the first heat treatment, a first oxide semiconductor layer 404 which is a non-single-crystal layer formed by crystal growth from the surface is formed (see FIG. 4A). The crystal layer formed in the vicinity of the surface is c-axis-aligned in a direction perpendicular to the surface.

Note that in the first heat treatment, it is preferable that water, hydrogen, and the like be not contained in nitrogen, oxygen or a rare gas such as helium, neon, or argon. In addition, nitrogen, oxygen, or a rare gas such as helium, neon, or argon which is introduced into a heat treatment apparatus preferably has a purity of 6N (99.9999%) or higher, more preferably 7N (99.99999%) or higher. Further, the first heat treatment may be performed in a dry air atmosphere with an $H_2O$ concentration of lower than or equal to 20 ppm.

In addition, at the time of increasing the temperature in the first heat treatment, the inside of a furnace may be set to a nitrogen atmosphere and the inside of the furnace may be switched to an oxygen atmosphere at the time of performing cooling. The inside portion of the first oxide semiconductor layer is supplied with oxygen so that an i-type oxide semiconductor layer is formed by changing the nitrogen atmosphere to the oxygen atmosphere after the dehydration or dehydrogenation is performed in the nitrogen atmosphere.

Next, a second oxide semiconductor layer whose thickness is larger than at least that of the first oxide semiconductor layer 404 is formed over the first oxide semiconductor layer 404 having a plate-like crystal. Note that the thickness of the second oxide semiconductor layer may be determined as appropriate in accordance with a device to be manufactured, by a practitioner. For example, in the case of manufacturing a bottom-gate transistor, the total thickness of the first oxide semiconductor layer 404 and the second oxide semiconductor layer is greater than or equal to 10 nm and less than or equal to 200 nm.

It is preferable that the first oxide semiconductor layer and the second oxide semiconductor layer be formed using materials containing the same components or have the same crystal structure and close lattice constants (lattice mismatch is less than or equal to 1%). In the case where the materials containing the same components are used, crystal growth is easily caused using a plate-like crystal of the first oxide semiconductor layer as a seed crystal in crystallization to be performed later. Further, in the case where the materials containing the same components are used, physical properties of an interface, such as adhesion, or electrical characteristics are favorable.

After that, by performing second heat treatment, crystal growth is caused with the use of a crystal in the crystal layer of the first oxide semiconductor layer as a seed crystal. The second heat treatment is performed at a temperature higher than or equal to 450° C. and lower than or equal to 850° C., preferably higher than or equal to 550° C. and lower than or equal to 650° C. Heating time is greater than or equal to 1 minute and less than or equal to 24 hours. By the second heat treatment, the second oxide semiconductor layer is crystallized. Thus, a second oxide semiconductor layer 406 which is crystallized can be obtained (see FIG. 4B).

Next, an oxide semiconductor layer formed of the first oxide semiconductor layer and the second oxide semiconductor layer is processed into an island-shaped first oxide semiconductor layer 404a and an island-shaped second oxide semiconductor layer 406a through a photolithography step. After a metal conductive film is formed over the gate insulating layer 402, the island-shaped first oxide semiconductor layer 404a, and the island-shaped second oxide semiconductor layer 406a by a sputtering method or the like, photolithography step is performed to form resist mask, and the metal conductive film is selectively etched, so that metal electrode layers are formed.

As the metal conductive film which are to be a source electrode layer and a drain electrode layer (including a wiring formed using the same layer as the source electrode layer and the drain electrode layer) later, a metal material such as Al, Cu, Cr, Ta, Ti, Mo, or W, or an alloy material containing the metal material as a component is used. Further, when an Al material to which an element preventing generation of hillocks and whiskers in an Al film, such as Si, Ti, Ta, W, Mo, Cr, Nd, Sc, or Y, is added is used, heat resistance can be increased.

For example, the metal conductive film preferably has a three-layer structure in which a titanium layer, an aluminum layer, and a titanium layer are stacked in this order. Alternatively, the metal conductive film can have a two-layer structure in which an aluminum layer and a tungsten layer are stacked, a two-layer structure in which a copper layer and a tungsten layer are stacked, or a two-layer structure in which an aluminum layer and a molybdenum layer are stacked. Needless to say, the metal conductive film may have a single-layer structure or a stacked-layer structure including four or more layers.

Next, the resist mask is removed, and a resist mask is formed through a photolithography step. Selective etching is performed to form the source electrode layer 408a and the drain electrode layer 408b. Then, the resist mask is removed. In this etching step, only part of the island-shaped second oxide semiconductor layer 406a is etched, and an oxide semiconductor layer having a groove (a depressed portion) is formed in some cases.

In order to reduce the number of photomasks used in a photolithography step and reduce the number of photolithography steps, an etching step may be performed with the use of a multi-tone mask which is a light-exposure mask through which light is transmitted to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Figure 4A:
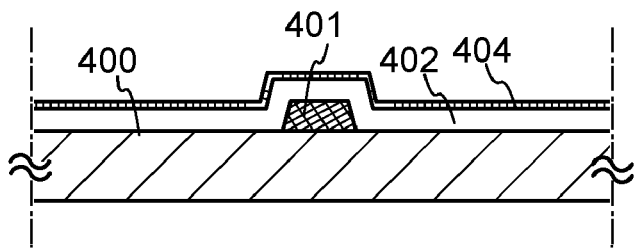
FIGS. 4A to 4E are cross-sectional process views illustrating one embodiment of the present invention.
Figure 4B:
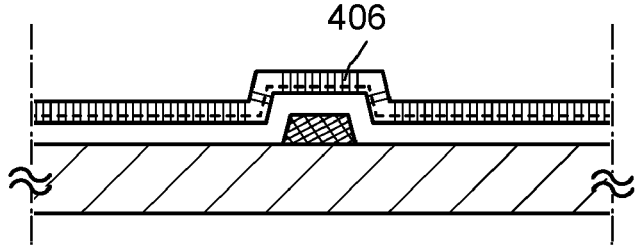
Figure 4C:
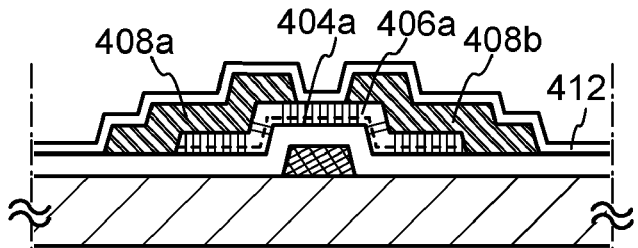

After an oxide insulating layer 412 serving as a protective insulating film is formed in contact with part of the oxide semiconductor layer, third heat treatment is performed (see FIG. 4C).

In Embodiment 2, a silicon oxide film is formed to a thickness of 300 nm as the oxide insulating layer 412 by a sputtering method. The substrate temperature in film formation may be higher than or equal to room temperature and lower than or equal to 300° C. and in Embodiment 2, is 100° C. The silicon oxide film can be formed by a sputtering method in a rare gas (typically, argon) atmosphere, an oxygen atmosphere, or a mixed atmosphere of a rare gas (typically, argon) and oxygen. As a target, a silicon oxide target or a silicon target can be used. For example, with the use of a silicon target, silicon oxide can be formed by a sputtering method in an atmosphere of oxygen and nitrogen. The oxide insulating layer 412 formed in contact with the island-shaped first oxide semiconductor layer 404a and the island-shaped second oxide semiconductor layer 406a which are crystallized has a thickness greater than or equal to 10 nm and less than or equal to 500 nm. Typically, a silicon oxide film, a silicon nitride oxide film, an aluminum oxide film, an aluminum oxynitride film or the like is used.

The temperature of the third heat treatment is set in the range of 200° C. to 450° C. inclusive, preferably 250° C. to 350° C. inclusive. For example, the heat treatment may be performed at 250° C. for 1 hour in an atmosphere containing oxygen. Through the third heat treatment, oxygen is supplied to the island-shaped first oxide semiconductor layer 404a and the island-shaped second oxide semiconductor layer 406a to reduce oxygen deficiency in the island-shaped first oxide semiconductor layer 404a and the island-shaped second oxide semiconductor layer 406a.

Figure 4D:
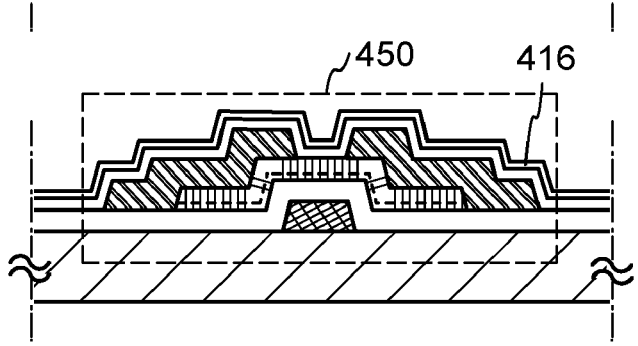

After an interlayer insulating layer 416 containing hydrogen is formed over the oxide insulating layer 412, fourth heat treatment is performed (see FIG. 4D). The interlayer insulating layer 416 containing hydrogen can be formed by a CVD method or the like. In Embodiment 2, a silicon nitride film which is one of nitride insulating layers containing hydrogen obtained by a CVD method is used.

The fourth heat treatment is performed in a nitrogen atmosphere at higher than or equal to 150° C. and lower than or equal to 450° C., preferably higher than or equal to 250° C. and lower than or equal to 440° C. In addition, the fourth heat treatment may be performed in an oxygen atmosphere, a rare gas atmosphere, or a dry air atmosphere without limitation on a nitrogen atmosphere.

The fourth heat treatment after the interlayer insulating layer 416 containing hydrogen is formed is a step in which hydrogen contained in the interlayer insulating layer 416 is diffused to terminate defects of the island-shaped first oxide semiconductor layer 404a and the island-shaped second oxide semiconductor layer 406a. Hydrogen can be diffused into the island-shaped first oxide semiconductor layer 404a and the island-shaped second oxide semiconductor layer 406a or an interface between these oxide semiconductor layers and SiOx layer (the silicon oxide layer) regardless of existence of the insulating film formed of a silicon oxide film (the oxide insulating layer 412).

As described above, a transistor 450 which includes the island-shaped second oxide semiconductor layer 406a formed by crystal growth from the crystal region of the island-shaped first oxide semiconductor layer 404a and in which defects are terminated by diffusing hydrogen contained in the interlayer insulating layer 416 is completed.

Figure 4E:
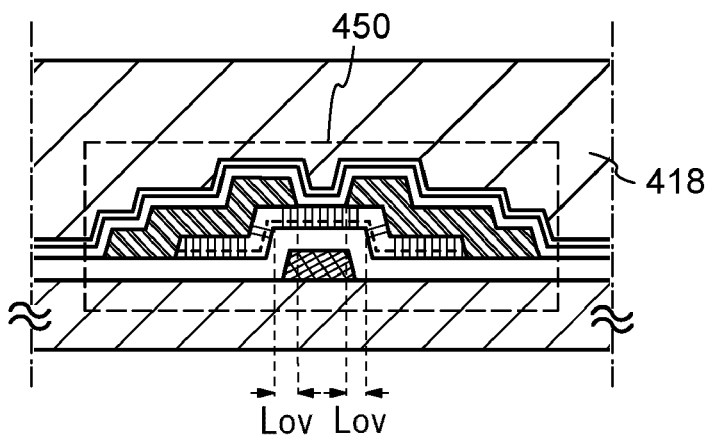

Then, an interlayer insulating layer 418 is formed over the interlayer insulating layer 416. A cross-sectional structure at this stage is illustrated in FIG. 4E. The interlayer insulating layer 418 is formed using a material containing an inorganic insulating material such as silicon oxide, silicon nitride oxide, silicon nitride, hafnium oxide, aluminum oxide, or tantalum oxide which is obtained by a PVD method, a CVD method, or the like. Alternatively, an organic resin such as acrylic can be used for a material of the interlayer insulating layer 418. Note that a stacked-layer structure of the interlayer insulating layers 416 and 418 is used in Embodiment 2, but one embodiment of the disclosed invention is not limited to this example. A single-layer structure or a stacked-layer structure including three or more layers can also be used.

Further, as illustrated in FIG. 4E, one feature of the gate electrode layer 401 is that it includes a region overlapped with the source electrode layer 408a (or the drain electrode layer 408b). The island-shaped oxide semiconductor layers include a region between an edge portion of the source electrode layer 408a and a step of the gate insulating layer 402, in other words, a region between the edge portion of the source electrode layer 408a and a point at which a flat surface is changed to a tapered surface of the gate insulating layer in the cross-sectional view (here, an $L_{OV}$ region in FIG. 4E). The $L_{OV}$ region is important in view of preventing carriers from flowing to a crystal grain boundary generated at an edge portion of the gate electrode layer.

Figure 5A:
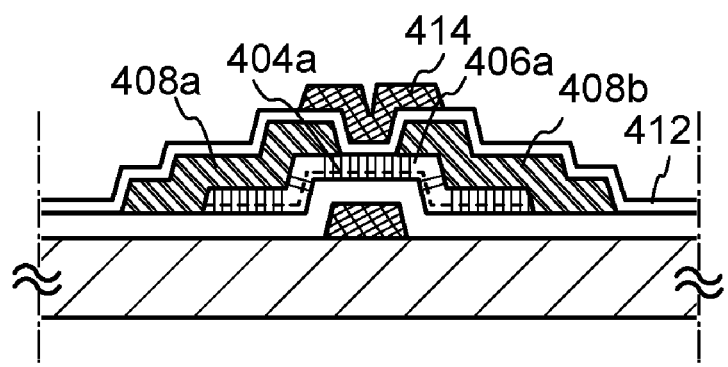
FIGS. 5A and 5B are cross-sectional process views illustrating one embodiment of the present invention.
Figure 5B:
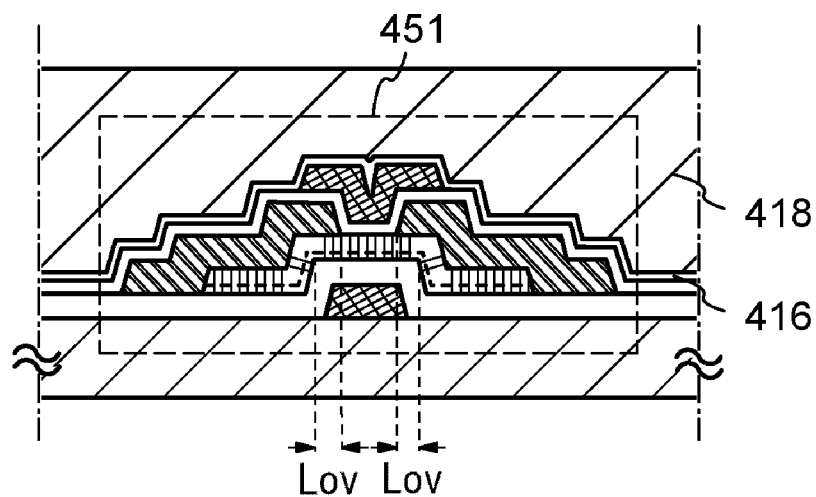

Furthermore, an electrode layer serving as a back gate may be formed over the oxide insulating layer 412. FIGS. 5A and 5B illustrate a manufacturing example of such a case. After a state of FIG. 4C is obtained, a contact hole reaching the gate electrode layer 401 is formed (not illustrated) and an electrode layer 414 is formed over the oxide insulating layer 412 (see FIG. 5A). Next, the interlayer insulating layer 416 containing hydrogen is formed over the electrode layer 414 and the oxide insulating layer 412. Then, the fourth heat treatment is performed, so that a transistor 451 illustrated in FIG. 5B can be obtained. The electrode layer 414 is provided at the position overlapped with the channel formation region in the oxide semiconductor layer, whereby the amount of change in threshold voltage of the transistor 451 between before and after a BT test (bias-temperature stress test) can be reduced. In addition, in the transistor formed using the oxide semiconductor layer including the c-axis-aligned non-single-crystal layer, the amount of change in threshold voltage of the transistor between before and after a BT test in which the transistor is continuously irradiated with light can be reduced. As a result, the transistor with stable electrical characteristics can be manufactured. The electrode layer 414 may have a potential different from that of the gate electrode layer 401 of the transistor 451. Alternatively, the potential of the electrode layer 414 may be GND or 0 V, or the electrode layer 414 may be in a floating state.

Embodiment 3

Figure 6:
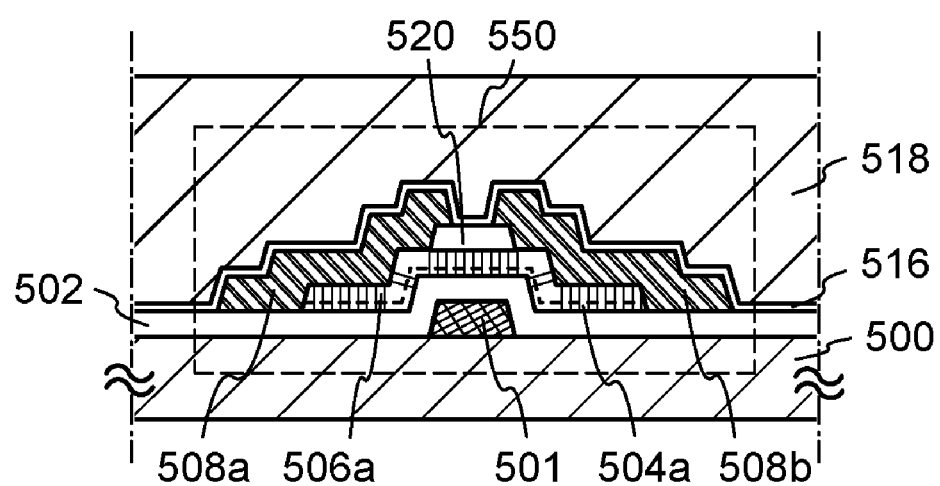
FIG. 6 is a cross-sectional view illustrating one embodiment of the present invention.

In Embodiment 3, an example of a channel stop transistor is shown with reference to FIG. 6.

Since Embodiment 3 is only partly different from Embodiment 2, detailed description is omitted here.

A procedure will be described below. Similarly to Embodiment 2, a gate electrode layer 501 and a gate insulating layer 502 are formed over a substrate 500; a first oxide semiconductor layer is formed, and first heat treatment is performed to crystallize the first oxide semiconductor layer; and a second oxide semiconductor layer is formed, and second heat treatment is performed to crystallize the second oxide semiconductor layer.

Next, an oxide insulating layer is formed and third heat treatment is performed. The oxide insulating layer is formed using the same material as that of the oxide insulating layer 412 described in Embodiment 2. In addition, the conditions of the third heat treatment are the same as those of the third heat treatment described in Embodiment 2, and oxygen is supplied to the first oxide semiconductor layer and the second oxide semiconductor layer to reduce oxygen deficiency in the first oxide semiconductor layer and the second oxide semiconductor layer.

Next, a resist mask is formed through a photolithography step over the oxide insulating layer. Selective etching is performed to form an island-shaped first oxide semiconductor layer 504a and an island-shaped second oxide semiconductor layer 506a.

Next, the resist mask is removed. A resist mask is formed through a photolithography step and selective etching is performed to form an island-shaped oxide insulating layer 520.

After a metal conductive film is formed over the island-shaped oxide insulating layer 520, the island-shaped first oxide semiconductor layer 504a, and the island-shaped second oxide semiconductor layer 506a by a sputtering method or the like, a resist mask is formed through a photolithography step. Selective etching is performed to form a source electrode layer 508a and a drain electrode layer 508b.

Next, an interlayer insulating layer 516 containing hydrogen is formed over the island-shaped oxide insulating layer 520, the source electrode layer 508a, and the drain electrode layer 508b, and then fourth heat treatment is performed. The conditions of the fourth heat treatment are the same as those of the fourth heat treatment described in Embodiment 2, and hydrogen is supplied to the first oxide semiconductor layer and the second oxide semiconductor layer to reduce deficiency in the first oxide semiconductor layer and the second oxide semiconductor layer.

As described above, a channel stop transistor 550 which includes the island-shaped second oxide semiconductor layer 506a formed by crystal growth from the crystal region of the island-shaped first oxide semiconductor layer 504a and in which defects are terminated by diffusing hydrogen contained in the interlayer insulating layer 516 is completed.

Next, an interlayer insulating layer 518 for planarization is formed over the interlayer insulating layer 516, so that a cross-sectional structure described in FIG. 6 can be obtained.

Note that Embodiment 3 can be freely combined with Embodiment 2.

Embodiment 4

In Embodiment 4, as an example of a case where the semiconductor device described in any of the above embodiments is used for a semiconductor integrated circuit, a semiconductor device having a stacked structure of the semiconductor device described in any of the above embodiments and a semiconductor device using another semiconductor material will be described with reference to FIG. 7.

Figure 7:
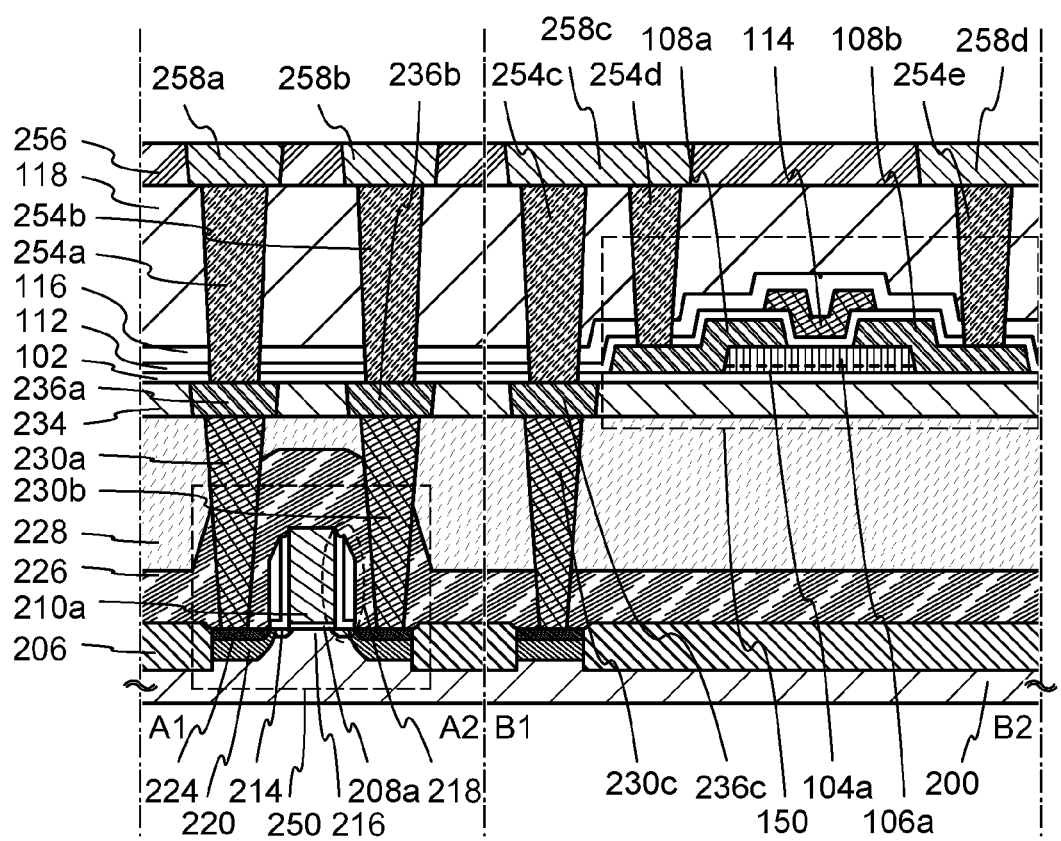
FIG. 7 is a cross-sectional view illustrating one embodiment of the present invention.

FIG. 7 is a cross-sectional view illustrating an example of a structure of a semiconductor device according to Embodiment 4. In FIG. 7, a cross section taken along line A1-A2 parallel to a channel length direction of a transistor 250, and a cross section taken along line B1-B2 parallel to a channel length direction of the transistor 150 are illustrated. The semiconductor device illustrated in FIG. 7 includes the transistor 250 using a material other than an oxide semiconductor (e.g., silicon) in the lower portion and the transistor 150 using an oxide semiconductor in the upper portion. The transistor 150 using an oxide semiconductor is the transistor 150 illustrated in FIG. 1. Although the transistors 250 and 150 are n-channel transistors here, p-channel transistors may be used. In particular, it is easy to use a p-channel transistor as the transistor 250.

The transistor 250 includes a channel formation region 216 which is provided in a substrate 200 containing a semiconductor material; impurity regions 214 between which the channel formation region 216 is sandwiched and high-concentration impurity regions 220 between which the channel formation region 216 is sandwiched (which are also collectively called impurity regions); a gate insulating layer 208a provided over the channel formation region 216; a gate electrode layer 210a provided over the gate insulating layer 208a; and a source or drain electrode layer 230a and a source or drain electrode layer 230b which are electrically connected to the impurity regions 214 (see FIG. 7).

Here, a sidewall insulating layer 218 is provided on a side surface of the gate electrode layer 210a. The high-concentration impurity regions 220 are provided in regions of the substrate 200 which do not overlap with the sidewall insulating layer 218 when seen from a direction perpendicular to a main surface of the substrate 200, and metal compound regions 224 in contact with the high-concentration impurity regions 220 are included. An element isolation insulating layer 206 is provided over the substrate 200 so as to surround the transistor 250. An interlayer insulating layer 226 and an interlayer insulating layer 228 are provided so as to cover the transistor 250. The source or drain electrode layer 230a and the source or drain electrode layer 230b are electrically connected to the metal compound regions 224 through openings formed in the interlayer insulating layers 226 and 228. In other words, the source or drain electrode layer 230a and the source or drain electrode layer 230b are electrically connected to the high-concentration impurity regions 220 and the impurity regions 214 through the metal compound regions 224. Similarly to the source or drain electrode layer 230a and the source or drain electrode layer 230b, an electrode 230c is formed in an opening provided in the interlayer insulating layers 226 and 228. In addition, an in insulating layer 234 is provided over the interlayer insulating layer 228. An electrode 236a, an electrode 236b, and an electrode 236c are provided so as to be embedded in the insulating layer 234. Here, the electrode 236a is in contact with the electrode 230a; the electrode 236b is in contact with the electrode 230b; and the electrode 236c is in contact with the electrode 230c.

The transistor 150 includes the island-shaped first oxide semiconductor layer 104a and the island-shaped second oxide semiconductor layer 106a which are provided over the insulating layer 102; the source electrode layer 108a and the drain electrode layer 108b which are provided over the island-shaped first oxide semiconductor layer 104a and the island-shaped second oxide semiconductor layer 106a and are electrically connected to the island-shaped first oxide semiconductor layer 104a and the island-shaped second oxide semiconductor layer 106a; the gate insulating layer 112 provided so as to cover the island-shaped first oxide semiconductor layer 104a, the island-shaped second oxide semiconductor layer 106a, the source electrode layer 108a, and the drain electrode layer 108b; and the gate electrode layer 114 provided over the gate insulating layer 112 in a region overlapped with the island-shaped second oxide semiconductor layer 106a (see FIG. 7).

In addition, the interlayer insulating layer 116 and the interlayer insulating layer 118 are provided over the transistor 150. Here, openings reaching the source electrode layer 108a and the drain electrode layer 108b are provided in the gate insulating layer 112, the interlayer insulating layer 116, and the interlayer insulating layer 118. Through the openings, an electrode 254d and an electrode 254e are formed in contact with the source electrode layer 108a and the drain electrode layer 108b, respectively. Similarly to the electrodes 254d and 254e, an electrode 254a, an electrode 254b, and an electrode 254c are formed in contact with the electrode 236a, the electrode 236b, and the electrode 236c, respectively, through openings provided in the gate insulating layer 112, the interlayer insulating layer 116, and the interlayer insulating layer 118.

An insulating layer 256 is provided over the interlayer insulating layer 118. An electrode 258a, an electrode 258b, an electrode 258c, and an electrode 258d are provided so as to be embedded in the insulating layer 256. Here, the electrode 258a is in contact with the electrode 254a; the electrode 258b is in contact with the electrode 254b; the electrode 258c is in contact with the electrode 254c and the electrode 254d; and the electrode 258d is in contact with the electrode 254e.

In other words, the source electrode layer 108a or the drain electrode layer 108b of the transistor 150 is electrically connected to another element (such as the transistor using a material other than an oxide semiconductor) through the electrode 230c, the electrode 236c, the electrode 254c, the electrode 258c, and the electrode 254d (see FIG. 7). In addition, the source electrode layer 108a or the drain electrode layer 108b of the transistor 150 is electrically connected to another element through the electrode 254e and the electrode 258d. Note that the structure of connection electrodes (such as the electrode 230c, the electrode 236c, the electrode 254c, the electrode 258c, and the electrode 254d) is not limited to the above structure, and appropriate addition, omission, or the like is possible.

Note that for part of the electrodes (e.g., the electrode 258a, the electrode 258b, the electrode 258c, and the electrode 258d), a material containing copper is preferably used. When a material containing copper is used for part of them, conductivity can be improved. An electrode or a wiring containing copper can be formed by a so-called damascene process or the like.

As described above, in Embodiment 4, a typical example of the semiconductor device having a stacked structure is described; however, one embodiment of the disclosed invention is not limited thereto. For example, a structure of a transistor, the number of insulating layers and arrangement thereof, the number of electrodes and wirings and a connection relation therebetween, and the like can be changed as appropriate. As an example of a connection relation between electrodes, a structure can be employed in which the gate electrode layer 210a of the transistor 250 and the source electrode layer 108a or the drain electrode layer 108b of the transistor 150 are electrically connected to each other.

A semiconductor device provided with electrical characteristics different from those of transistors using an oxide semiconductor can be realized by a combination of a transistor using a material other than an oxide semiconductor and a transistor using an oxide semiconductor.

The structures, methods, and the like described in Embodiment 4 can be combined as appropriate with any of the structures, methods, and the like described in the other embodiments.

Embodiment 5

In Embodiment 5, an example of a structure of a semiconductor device which functions as a memory device is described as a specific example of a semiconductor device according to one embodiment of the disclosed invention. Note that a semiconductor device including a transistor using an oxide semiconductor and a transistor using a material other than an oxide semiconductor (e.g., silicon) is described here.

Figure 8:
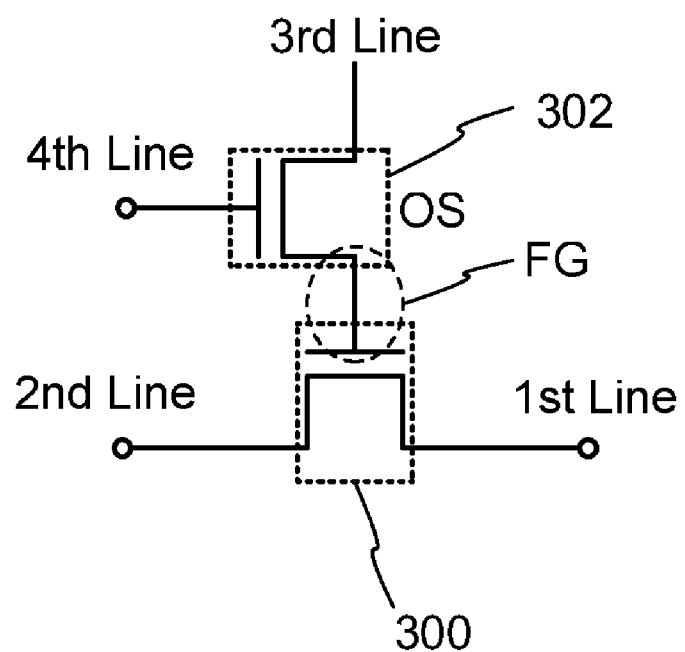
FIG. 8 is an equivalent circuit diagram illustrating one embodiment of the present invention.

In the semiconductor device in FIG. 8, a gate electrode of a transistor 300 and one of a source electrode and a drain electrode of a transistor 302 are electrically connected to each other. A first wiring (a 1st line, also referred to as a source line) is electrically connected to a source electrode of the transistor 300. A second wiring (a 2nd line, also referred to as a bit line) is electrically connected to a drain electrode of the transistor 300. A third wiring (a 3rd line, also referred to as a first signal line) is electrically connected to the other of the source electrode and the drain electrode of the transistor 302. A fourth wiring (a 4th line, also referred to as a second signal line) is electrically connected to a gate electrode of the transistor 302. Here, a material other than an oxide semiconductor (e.g., silicon) is used for the transistor 300 and an oxide semiconductor material is used for the transistor 302.

Since the transistor 300 using a material other than an oxide semiconductor can operate at higher speed than the transistor 302 using an oxide semiconductor, stored data can be read at high speed by using the transistor 300. Moreover, the transistor 302 using an oxide semiconductor has extremely low off-state current. For that reason, a potential of the gate electrode of the transistor 300 can be held for an extremely long time by turning off the transistor 302.

The source electrode or the drain electrode of the transistor 302 is electrically connected to the gate electrode of the transistor 300, thereby having an effect similar to that of a floating gate of a floating gate transistor used for a nonvolatile memory element. Therefore, in Embodiment 5, a portion where the source electrode or the drain electrode of the transistor 302 is electrically connected to the gate electrode of the transistor 300 is called a floating gate portion FG. The floating gate portion FG is embedded in an insulator and thus can store electric charge. The off-state current of the transistor 302 is about 100000 times lower than that of the transistor 300 formed using a silicon semiconductor, so that loss of electric charge stored in the floating gate portion FG due to leakage of the transistor 302 can be ignored.

With such a structure, deterioration of a gate insulating film (a tunnel insulating film), which has been mentioned in a conventional floating gate transistor can be avoided. That is, this structure can avoid deterioration of a gate insulating film due to a tunneling current generated when electrons are injected into a floating gate. For that reason, a limitation on the number of writings can be theoretically ignored in the semiconductor devices illustrated in FIG. 1.

Note that a capacitor may be added to the floating gate portion FG. Addition of a capacitor to the floating gate portion FG facilitates holding of charge and suppressing a potential change of the floating gate portion FG due to a potential change of each wiring.

The semiconductor device in FIG. 8 utilizes the advantage that the potential of the gate electrode of the transistor 300 can be held, whereby writing, holding, and reading of data can be performed as described below.

Firstly, writing and holding of data will be described. First, a potential of the fourth wiring is set to a potential at which the transistor 302 is turned on, and the transistor 302 is turned on. Thus, a potential of the third wiring is supplied to the gate electrode of the transistor 300 (writing). After that, the potential of the fourth wiring is set to a potential at which the transistor 302 is turned off, and the transistor 302 is turned off, whereby the potential of the gate electrode of the transistor 300 is held (holding).

Since the off-state current of the transistor 302 is extremely low, the potential of the gate electrode of the transistor 300 is held for a long time. For example, when the potential of the gate electrode of the transistor 300 is a potential at which the transistor 300 is turned on, the on state of the transistor 300 is kept for a long time. Moreover, when the potential of the gate electrode of the transistor 300 is a potential at which the transistor 300 is turned off, the off state of the transistor 300 is kept for a long time.

Secondly, reading of data will be described. When a predetermined potential (a low potential) is supplied to the first wiring in a state where the on state or the off state of the transistor 300 is kept as described above, a potential of the second wiring varies whether the transistor 300 is in the on state or in the off state. For example, when the transistor 300 is in an on state, the potential of the second wiring becomes lower than the potential of the first wiring. In contrast, when the transistor 300 is in an off state, the potential of the second wiring is not changed.

In such a manner, the potential of the first wiring and the potential of the second wiring are compared with each other in a state where data is held, whereby the data can be read out.

Thirdly, rewriting of data will be described. Rewriting of data is performed in a manner similar to that of the writing and holding of data. In other words, the potential of the fourth wiring is set to be a potential to make the transistor 302 be in an on state, whereby the transistor 302 is made to be in an on state. Thus, the potential of the third wiring (a potential for new data) is supplied to the gate electrode of the transistor 300. After that, the potential of the fourth wiring is set to a potential at which the transistor 302 is turned off, and the transistor 302 is turned off, whereby the new data is stored.

In the semiconductor device according to one embodiment of the disclosed invention, data can be directly rewritten by another writing of data as described above. For that reason, erasing operation which is necessary for a flash memory and the like is not needed, so that a reduction in operation speed because of erasing operation can be prevented. In other words, high-speed operation of the semiconductor device can be realized.

The semiconductor device according to Embodiment 5 can store data for an extremely long time because the transistor 302 has low off-state current characteristics. That is, refresh operation which is necessary in a DRAM and the like is not needed, so that power consumption can be suppressed. Moreover, the semiconductor device according to Embodiment 5 can be used as a substantially non-volatile semiconductor device.

Further, since data writing or the like is performed with switching operation of the transistor 302, high voltage is not necessary and deterioration of the element does not occur. Furthermore, data is written and erased depending on and off of the transistor, whereby high-speed operation can be easily realized.

Since a transistor using a material other than an oxide semiconductor can operate at higher speed than a transistor using an oxide semiconductor, stored data can be read at high speed by using the transistor using a material other than an oxide semiconductor.

Note that an n-type transistor (an n-channel transistor) in which electrons are majority carriers is used in the above description; it is needless to say that a p-type transistor in which holes are majority carriers can be used instead of the n-type transistor.

The semiconductor device according to Embodiment 5 can be formed, for example, using the stacked structure of transistors described in Embodiment 4. Needless to say, one embodiment of the disclosed invention is not necessarily limited to a stacked structure of transistors. For example, the transistor 300 and the transistor 302 may be formed on the same surface. Further, since the semiconductor device according to Embodiment 5 utilizes low off-state current of the transistor 302, there is no particular limitation on the transistor 300. For example, the transistor 300 is formed using a material other than an oxide semiconductor in Embodiment 5; however, an oxide semiconductor may be used.

In Embodiment 5, the semiconductor device with a minimum storage unit is described for simplification; however, the structure of the semiconductor device is not limited thereto. A more advanced semiconductor device can be formed by connecting a plurality of semiconductor devices as appropriate. For example, a NAND-type or NOR-type semiconductor device can be formed by using a plurality of the above-described semiconductor devices. The structure of the wiring is not limited to that illustrated in FIG. 8 and can be changed as appropriate.

The structures, methods, and the like described in Embodiment 5 can be combined as appropriate with any of the structures, methods, and the like described in the other embodiments.

Embodiment 6

In Embodiment 6, a transistor including a c-axis-aligned oxide semiconductor layer is manufactured, and by using the transistor for a pixel portion, and further a driver circuit, a semiconductor device having a display function (also referred to as a display device) is manufactured. Furthermore, when part or whole of a driver circuit is formed over the same substrate as a pixel portion, a system-on-panel can be obtained.

Figure 9A:
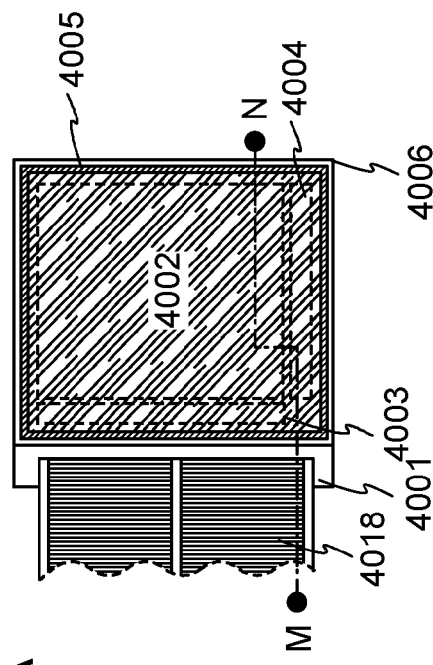
FIGS. 9A and 9B are a top view and a cross-sectional view illustrating one embodiment of the present invention.
Figure 9B:
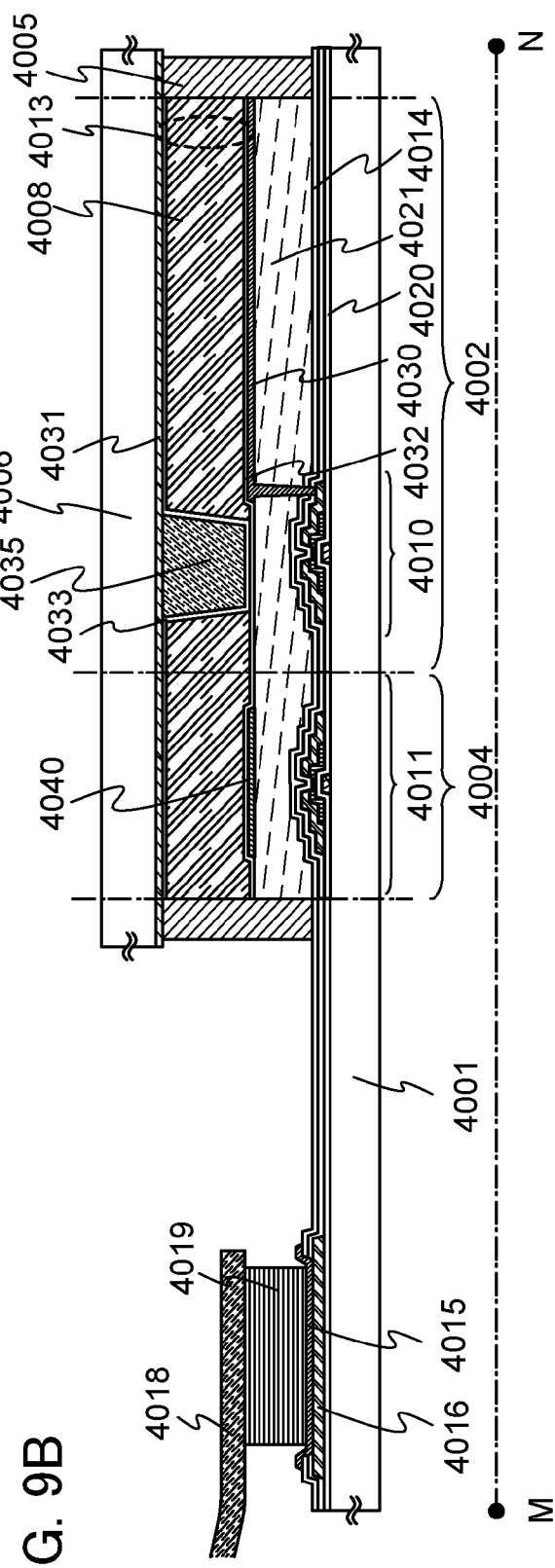

In Embodiment 6, an example of a liquid crystal display device is described as a semiconductor device which is one embodiment of the present invention. The appearance and a cross section of a liquid crystal display panel, which is one embodiment of a semiconductor device, are described with reference to FIGS. 9A and 9B. FIG. 9A is a top view of a panel in which transistors 4010 and 4011 which include a c-axis-aligned oxide semiconductor layer, and a liquid crystal element 4013, which are formed over a first substrate 4001, are sealed between the first substrate 4001 and a second substrate 4006 with a sealant 4505. FIG. 9B corresponds to a cross-sectional view of FIG. 9A along line M-N.

The sealant 4005 is provided so as to surround a pixel portion 4002, a signal line driver circuit 4003, and a scan line driver circuit 4004 which are provided over the first substrate 4001. The second substrate 4006 is provided over the pixel portion 4002, the signal line driver circuit 4003, and the scan line driver circuit 4004. Therefore, the pixel portion 4002, the signal line driver circuit 4003, and the scan line driver circuit 4004 are sealed together with a liquid crystal layer 4008, by the first substrate 4001, the sealant 4005, and the second substrate 4006.

Further, the pixel portion 4002, the signal line driver circuit 4003, and the scan line driver circuit 4004 provided over the first substrate 4001 each include a plurality of transistors. FIG. 9B illustrates the transistor 4010 included in the pixel portion 4002 and the transistor 4011 included in the scan line driver circuit 4004. Insulating layers 4020, 4014, and 4021 are provided over the transistors 4010 and 4011.

For the transistors 4010 and 4011, the transistor including the c-axis-aligned oxide semiconductor layer in Embodiment 2 can be used. In Embodiment 6, the transistors 4010 and 4011 are n-channel transistors.

A conductive layer 4040 is provided over part of the insulating layer 4021 which overlaps with a channel formation region of an oxide semiconductor layer in the transistor 4011 for the driver circuit. The conductive layer 4040 is provided at the position overlapped with the channel formation region of the oxide semiconductor layer, whereby the amount of change in the threshold voltage of the transistor 4011 between before and after a BT test can be reduced. In addition, in the transistor formed using the oxide semiconductor layer including the c-axis-aligned non-single-crystal layer, the amount of change in threshold voltage of the transistor between before and after a BT test in which the transistor is successively irradiated with light can be reduced. As a result, the transistor with stable electrical characteristics can be manufactured. The conductive layer 4040 may have the same potential as or have potential different from that of a gate electrode layer of the transistor 4011 and can function as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 provided therebetween.

Note that as the second substrate 4006, glass or plastic can be used.

A columnar spacer 4035 which can be obtained in such a manner that an insulating layer is selectively etched is provided to control a distance (a cell gap) between the pixel electrode layer 4030 and the counter electrode layer 4031. Alternatively, a spherical spacer may be used. The counter electrode layer 4031 is electrically connected to a common potential line provided over the same insulating substrate as the transistor 4010. In addition, with the use of a common connection portion, the counter electrode layer 4031 and the common potential line can be electrically connected to each other by conductive particles arranged between the pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes a liquid crystal showing a blue phase and a chiral agent has a short response time of 1 msec or less, has optical isotropy, which makes the alignment process unneeded, and has a small viewing angle dependence.

When liquid crystal exhibiting a blue phase is used, rubbing treatment on an alignment film is unnecessary; accordingly, electrostatic discharge damage caused by the rubbing treatment can be prevented and defects and damage of the liquid crystal display device in the manufacturing process can be reduced. Thus, productivity of the liquid crystal display device can be increased. A transistor that uses an oxide semiconductor layer particularly has a possibility that electrical characteristics of the transistor may fluctuate significantly by the influence of static electricity and deviate from the designed range. Therefore, it is more effective to use a liquid crystal material exhibiting a blue phase for the liquid crystal display device including a transistor that uses an oxide semiconductor layer.

Note that the liquid crystal display device described in Embodiment 6 is an example of a transmissive liquid crystal display device; however, the liquid crystal display device may be either a reflective liquid crystal display device or a semi-transmissive liquid crystal display device.

An example of the liquid crystal display device described in Embodiment 6 is illustrated in which a polarizing plate is provided on the outer side of the substrate (on the viewer side) and a coloring layer (color filter) and an electrode layer used for a display element are provided on the inner side of the substrate in that order; however, the polarizing plate may be provided on the inner side of the substrate. The stacked structure of the polarizing plate and the coloring layer is not limited to Embodiment 6 and may be set as appropriate depending on materials of the polarizing plate and the coloring layer or conditions of manufacturing process. A light-blocking layer which functions as a black matrix may be provided when needed.

In Embodiment 6, in order to reduce surface unevenness of the transistors and to improve reliability of the transistors, the transistors are covered with the insulating layers (the insulating layer 4020, the insulating layer 4014, and the insulating layer 4021) which function as protective layers or planarization insulating layers. Note that the protective layer is provided to prevent entry of a contaminant impurity such as an organic substance, a metal substance, or moisture floating in air and is preferably a dense film. The protective layer may be formed with a single layer or a stacked layer of a silicon oxide layer, a silicon nitride layer, a silicon oxynitride layer, a silicon nitride oxide layer, an aluminum oxide layer, an aluminum nitride layer, aluminum oxynitride layer, and/or an aluminum nitride oxide layer by a sputtering method.

Here, the insulating layer having a stacked-layer structure is formed as the protective layer. Here, as a first layer of the insulating layer 4020, a silicon oxide layer is formed by a sputtering method. The use of the silicon oxide layer for the protective layer can reduce oxygen deficiency by adding oxygen to the oxide semiconductor layer which is in contact with the protective layer.

The insulating layer 4014 is formed as a second layer of the protective layer. Here, as the second layer of the insulating layer 4014, a silicon nitride layer which is one of nitride insulating layers containing hydrogen is formed by a plasma CVD method, and then heat treatment is performed so that hydrogen is diffused into the oxide semiconductor layer. The use of the silicon nitride layer as the protective layer can prevent ions such as sodium ions from entering a semiconductor region, thereby suppressing variations in electrical characteristics of the transistor.

The insulating layer 4021 is formed as the planarizing insulating layer. As the insulating layer 4021, an organic material such as acrylic can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating layers formed of these materials.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Further, a variety of signals and potentials are supplied to the signal line driver circuit 4003, the scan line driver circuit 4004, or the pixel portion 4002, which are formed over the same substrate, from an FPC 4018.

In Embodiment 6, a connection terminal electrode 4015 is formed using the same conductive layer as the pixel electrode layer 4030 included in the liquid crystal element 4013. A terminal electrode 4016 is formed using the same conductive layer as the source and drain electrode layers included in the transistors 4010 and 4011.

The connection terminal electrode 4015 is electrically connected to a terminal included in the FPC 4018 through an anisotropic conductive layer 4019.

In addition, if needed, a color filter is provided in each of the pixels. Furthermore, a polarizing plate or a diffusion plate is provided on the outer side of the first substrate 4001 and the second substrate 4006. Further, a light source of a backlight is formed using a cold-cathode tube or an LED. Thus, a liquid crystal display module is obtained.

The liquid crystal display module can employ a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti ferroelectric liquid crystal) mode, or the like.

Through the above process, a liquid crystal display device can be manufactured.

The transistor including the c-axis-aligned oxide semiconductor layer described in Embodiment 2 includes an oxide semiconductor layer having excellent crystallinity and has high field-effect mobility; therefore, a liquid crystal display device is manufactured using the transistor as described in Embodiment 6, so that a liquid crystal display device having excellent display characteristics is realized.

Embodiment 6 can be implemented in appropriate combination with the structures described in the other embodiments.

Embodiment 7

Figure 10A:
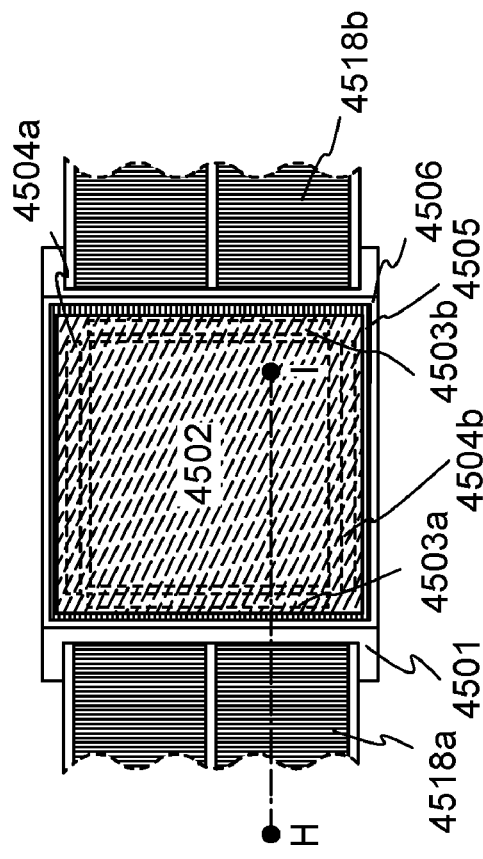
FIGS. 10A and 10B are a top view and a cross-sectional view illustrating one embodiment of the present invention.
Figure 10B:
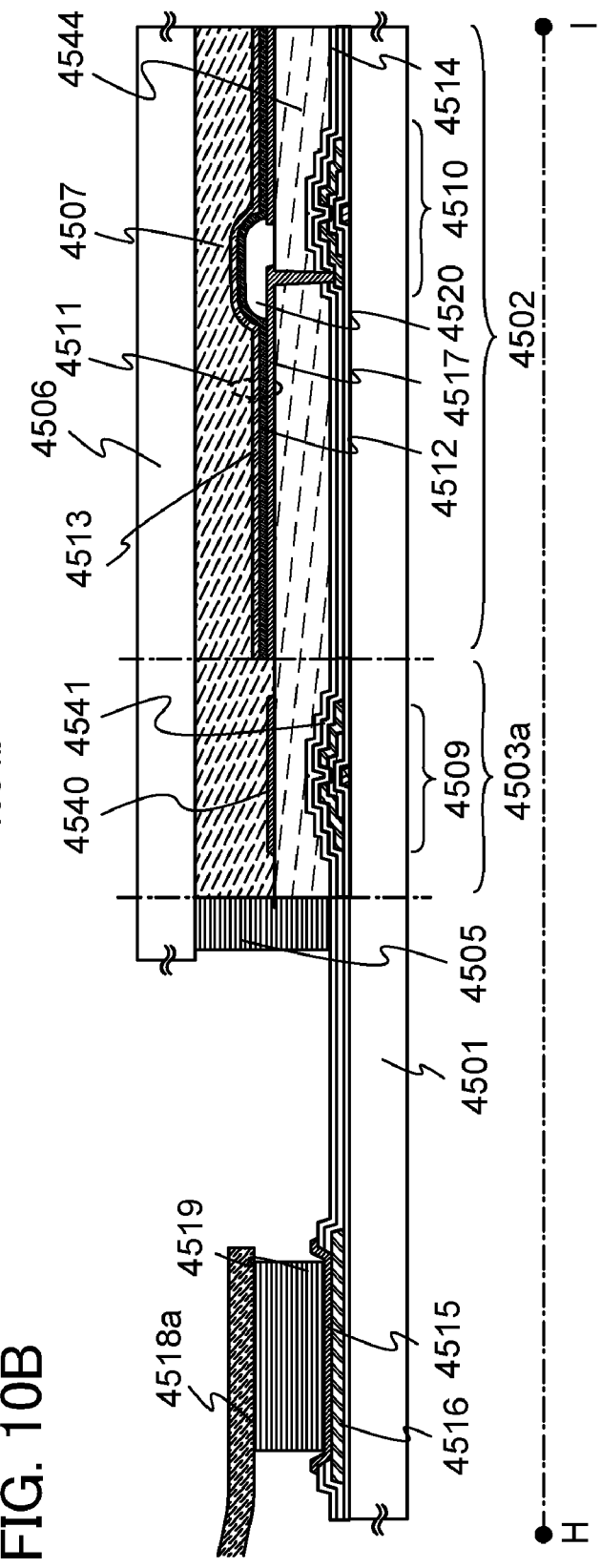

The appearance and a cross section of a light-emitting display panel (also referred to as a light-emitting panel) which is one mode of a semiconductor device will be described with reference to FIGS. 10A and 10B. FIG. 10A is a plan view of a panel in which a transistor which includes a c-axis-aligned oxide semiconductor layer and a light-emitting element formed over a first substrate are sealed between the first substrate and a second substrate with a sealant. FIG. 10B is a cross-sectional view taken along line H-I of FIG. 10A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of transistors, and a transistor 4510 included in the pixel portion 4502 and a transistor 4509 included in the signal line driver circuit 4503a are illustrated as an example in FIG. 10B.

For the transistors 4509 and 4510, the transistor with high mobility which includes the c-axis-aligned oxide semiconductor layer which is described in Embodiment 2 can be employed. In Embodiment 7, the transistors 4509 and 4510 are n-channel transistors.

Over an insulating layer 4544, a conductive layer 4540 is provided in a position overlapped with a channel formation region of an oxide semiconductor layer of the transistor 4509 used for a driver circuit. Further, potential of the conductive layer 4540 may be the same as or different from that of a gate electrode layer of the transistor 4509. The conductive layer 4540 can function also as a second gate electrode layer. Alternatively, the potential of the conductive layer 4540 may be GND or 0 V, or the conductive layer 4540 may be in a floating state.

In the transistor 4509, as a protective insulating layer, an insulating layer 4541 is formed in contact with a semiconductor layer including a channel formation region. The oxide insulating layer 4541 can be formed using a material and a method which are similar to those of the oxide insulating layer 412 described in Embodiment 2. Further, a protective insulating layer 4514 is formed over the insulating layer 4541. The protective insulating layer 4514 may be formed using a material and a method which are similar to those of the interlayer insulating layer 416 described in Embodiment 2. Here, as the protective insulating layer 4514, a silicon nitride layer is formed by a PCVD method.

Further, over the protective insulating layer 4514, the insulating layer 4544 is formed as the planarization insulating layer which reduces surface unevenness of the transistors. The insulating layer 4544 may be formed using a material and a method which are similar to those of the insulating layer 4021 described in Embodiment 6. Here, acrylic is used for the insulating layer 4544.

Moreover, a first electrode layer 4517 which is a pixel electrode included in the light-emitting element 4511 is electrically connected to a source or drain electrode layer of the transistor 4510. Note that the structure of the light-emitting element 4511 is, but not limited to, the stacked-layer structure which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition 4520 is made of an organic resin layer or an inorganic insulating layer. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective layer may be formed over the second electrode layer 4513 and the partition 4520 in order to prevent oxygen, hydrogen, moisture, carbon dioxide, or the like from entering into the light-emitting element 4511. As the protective layer, a silicon nitride layer, a silicon nitride oxide layer, a DLC layer, or the like can be formed.

In addition, a variety of signals and potentials are supplied to the signal line driver circuit 4503a, the signal line driver circuit 4503b, the scan line driver circuit 4504a, the scan line driver circuit 4504b, or the pixel portion 4502 from FPCs 4518a and 4518b.

A connection terminal electrode 4515 is formed using the same conductive layer as the first electrode layer 4517 included in the light-emitting element 4511, and a terminal electrode 4516 is formed using the same conductive layer as the source and drain electrode layers included in the transistors 4509 and 4510.

The connection terminal electrode 4515 is electrically connected to a terminal included in the FPC 4518a through an anisotropic conductive layer 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. An acrylic resin, an epoxy resin, or the like can be used. For example, nitrogen may be used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element.

Through the above steps, a light-emitting display device (display panel) can be manufactured.

The transistor including the c-axis-aligned oxide semiconductor layer described in Embodiment 2 includes an oxide semiconductor layer having excellent crystallinity and has high field-effect mobility; therefore, a light-emitting display device is manufactured using the transistor as described in Embodiment 7, so that a light-emitting display device having excellent display characteristics is realized.

Embodiment 7 can be implemented in appropriate combination with the structures described in the other embodiments.

Embodiment 8

An example of electronic paper will be described as one mode of a semiconductor device.

A transistor including a c-axis-aligned oxide semiconductor layer obtained by the method described in Embodiment 2 may be used for electronic paper. The electronic paper is also called an electrophoretic display device (electrophoretic display) and has advantages in that it has the same level of readability as regular paper, it has less power consumption than other display devices, and it can be set to have a thin and light form.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and/or the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules is arranged as appropriate so as to be interposed between two electrodes over an active matrix substrate, an active matrix display device can be completed, and display can be performed by application of an electric field to the microcapsules. For example, an active matrix substrate which is formed using the transistor including a c-axis-aligned oxide semiconductor layer described in Embodiment 2 can be used.

Note that the first particles and the second particles in the microcapsules can each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 11:
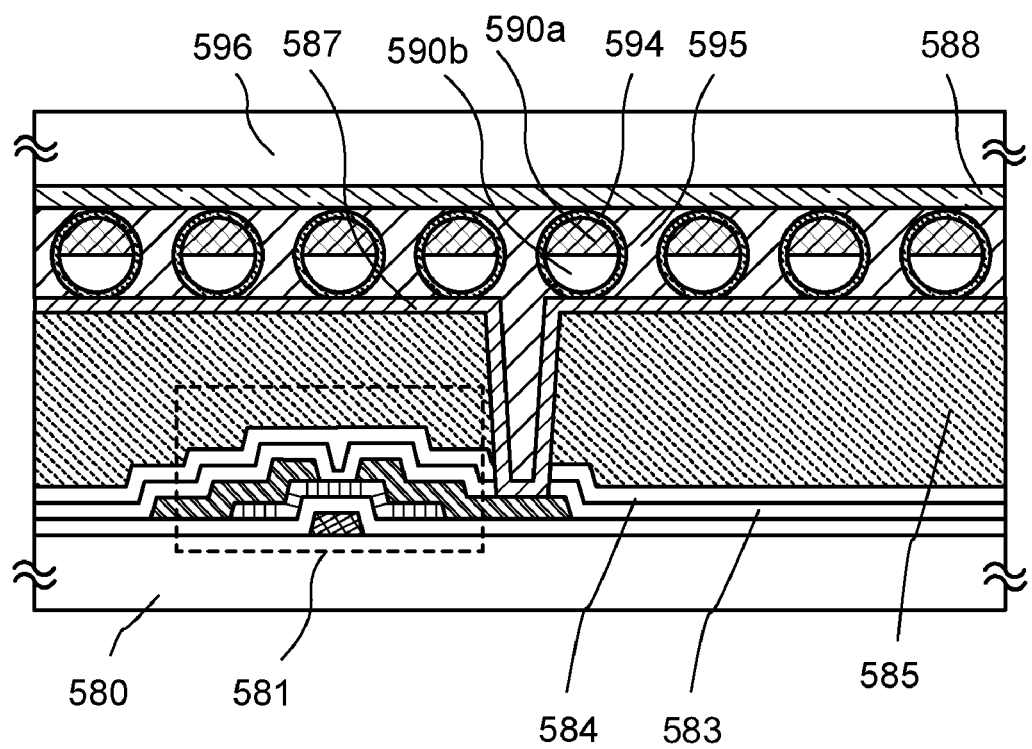
FIG. 11 a cross-sectional view illustrating one embodiment of the present invention.

FIG. 11 illustrates active matrix electronic paper as an example of a semiconductor device. A transistor 581 used for the semiconductor device can be manufactured in a manner similar to that of the transistor described in Embodiment 2 and is a transistor with high mobility which includes a c-axis-aligned oxide semiconductor layer. In addition, an insulating layer 584 is a nitride insulating layer containing hydrogen and is provided for supplying hydrogen to the c-axis-aligned oxide semiconductor layer.

The electronic paper in FIG. 11 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The transistor 581 is a bottom-gate transistor and is covered with an insulating layer 583. A source or drain electrode layer of the transistor 581 is electrically connected to a first electrode layer 587 through an opening formed in the insulating layers 583, an insulating layer 584, and an insulating layer 585. A cavity 594 exists between the first electrode layer 587 and a second electrode layer 588. The cavity 594 is filled with liquid and spherical particles each having a black region 590a and a white region 590b. A space around the cavity 594 is filled with a filler 595 such as a resin. These are provided between a first substrate 580 and a second substrate 596 (see FIG. 11).

In addition, the first electrode layer 587 corresponds to a pixel electrode, and the second electrode layer 588 corresponds to a common electrode. The second electrode layer 588 is electrically connected to a common potential line provided over the same insulating substrate as the transistor 581. With the use of a common connection portion, the second electrode layer 588 can be electrically connected to the common potential line through conductive particles provided between the pair of substrates.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and can be used in an electronic paper.

Through this process, electronic paper can be manufactured.

In Embodiment 8, with the use of the transistor including the c-axis-aligned oxide semiconductor layer described in Embodiment 2, so-called electronic paper is manufactured. The transistor includes an oxide semiconductor layer having excellent crystallinity and has high field-effect mobility; therefore, electronic paper is manufactured using the transistor, so that electronic paper having excellent display characteristics is realized.

Embodiment 8 can be implemented in appropriate combination with the structures described in the other embodiments.

Embodiment 9

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

In Embodiment 9, examples of an electronic appliance mounted with a display device which can be obtained in any of Embodiments 6 to 8 are described with reference to FIGS. 12A to 12E and FIG. 13.

Figure 12A:
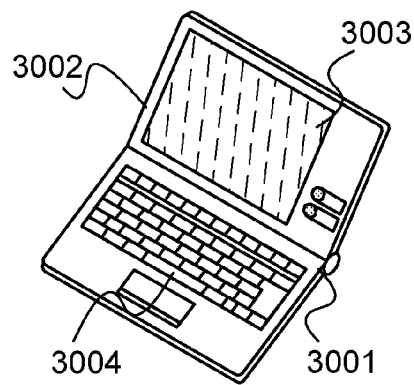
FIGS. 12A to 12E are diagrams illustrating examples of electronic appliances.

FIG. 12A illustrates a laptop personal computer manufactured by mounting at least a display device as a component, which includes a main body 3001, a housing 3002, a display portion 3003, a keyboard 3004, and the like. Note that the laptop personal computer includes the liquid crystal display device described in Embodiment 6.

Figure 12D:
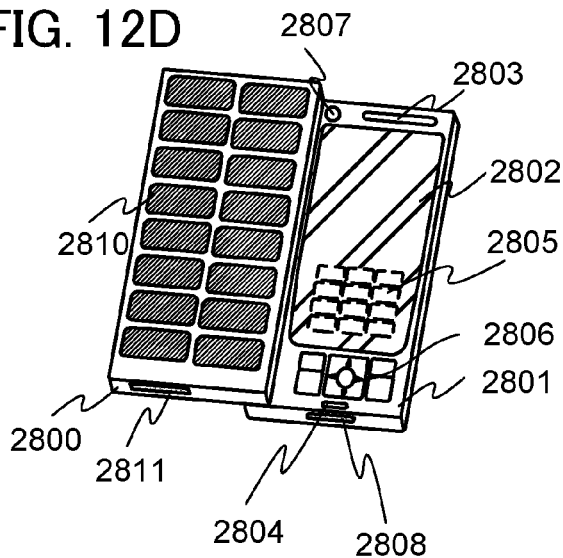
Figure 12B:
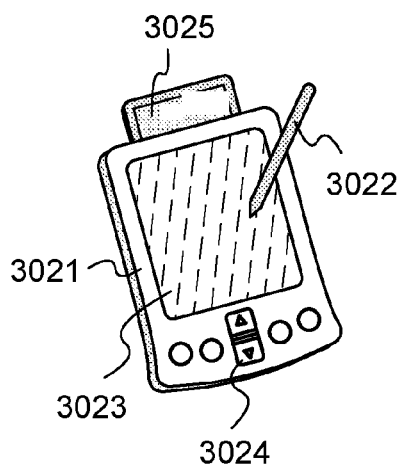

FIG. 12B is a portable information terminal (PDA) manufactured by mounting at least a display device as a component, which includes a display portion 3023, an external interface 3025, an operation button 3024, and the like in a main body 3021. A stylus 3022 is included as an accessory for operation. Note that the portable information terminal includes the light-emitting display device described in Embodiment 7.

Figure 12E:
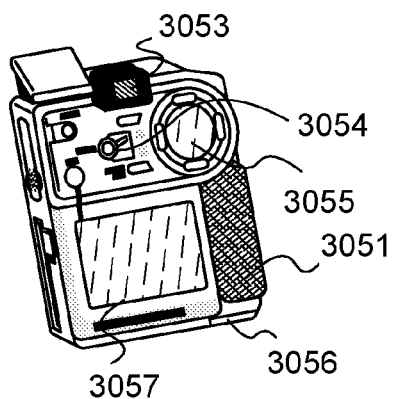
Figure 12C:
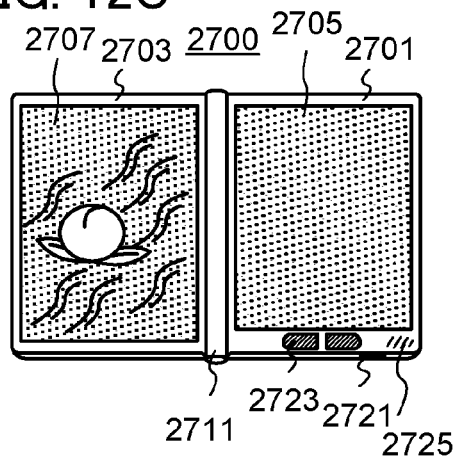

FIG. 12C is an e-book reader mounted with the electronic paper described in Embodiment 8 as a component. An e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 12C) can display text and the left display portion (the display portion 2707 in FIG. 12C) can display images.

FIG. 12C illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

FIG. 12D is a mobile phone manufactured by mounting at least a display device as a component, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2800 is provided with a solar battery cell 2810 for charging the portable information terminal, an external memory slot 2811, and the like. Further, an antenna is incorporated in the housing 2801.

The display panel 2802 has a function as a touch panel. A plurality of operation keys 2805 which is displayed as images is illustrated by dashed lines in FIG. 12D. Note that the display panel 2802 is also mounted with a booster circuit for raising a voltage output from the solar battery cell 2810 to a voltage needed for each circuit.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 12D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer or the like are possible. Moreover, a large amount of data can be stored by inserting a storage medium into the external memory slot 2811 and can be moved.

Further, in addition to the above functions, an infrared communication function, a television reception function, or the like may be provided.

FIG. 12E is a digital camera manufactured by mounting at least a display device as a component, which includes a main body 3051, a display portion (A) 3057, an eyepiece 3053, operation switches 3054, a display portion (B) 3055, a battery 3056, and the like.

Figure 13:
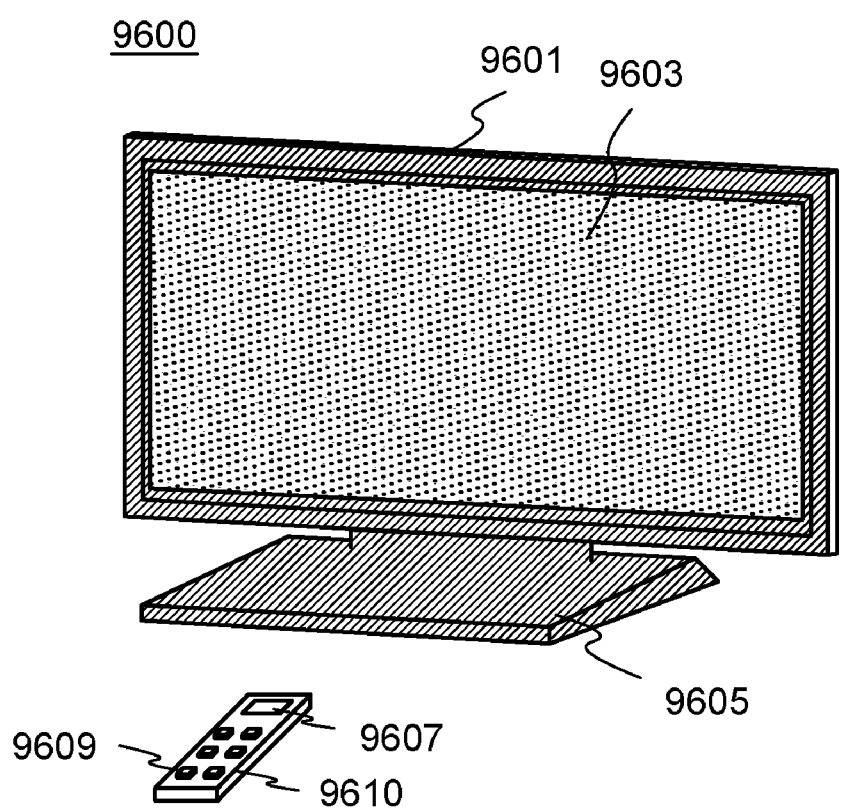
FIG. 13 is a diagram illustrating an example of an electronic appliance.

FIG. 13 illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the television set 9600 is connected to a communication network with or without wires via the modem, one-way (from a sender to a receiver) or two-way (between a sender and a receiver, between receivers, or the like) information communication can be performed.

In the display portion 9603, a plurality of transistors described in Embodiment 2 are provided as switching elements of pixels, and the transistor having high mobility described in Embodiment 2 is provided in a driver circuit formed over the same insulating substrate as the display portion 9603.

Embodiment 9 can be freely combined with any one of Embodiments 1 to 8.

This application is based on Japanese Patent Application serial no. 2009-279001 filed with Japan Patent Office on Dec. 8, 2009, the entire contents of which are hereby incorporated by reference.

EXPLANATION OF REFERENCE

100: substrate, 102: insulating layer, 104: first oxide semiconductor layer, 104a: island-shaped first oxide semiconductor layer, 105: second oxide semiconductor layer, 106: second oxide semiconductor layer, 106a: island-shaped second oxide semiconductor layer, 108: conductive layer, 108a: source electrode layer, 108b: drain electrode layer, 112: gate insulating layer, 114: gate electrode layer, 116: interlayer insulating layer, 118: interlayer insulating layer, 150: transistor, 200: substrate, 206: element isolation insulating layer, 208a: gate insulating layer, 210a: gate electrode layer, 214: impurity region, 216: channel formation region, 218: sidewall insulating layer, 220: high-concentration impurity region, 224: metal compound region, 226: interlayer insulating layer, 228: interlayer insulating layer, 230a: source or drain electrode layer, 230b: source or drain electrode layer, 230c: electrode, 234: insulating layer, 236a: electrode, 236b: electrode, 236c: electrode, 250: transistor, 254a: electrode, 254b: electrode, 254c: electrode, 254d: electrode, 254e: electrode, 256: insulating layer, 258a: electrode, 258b: electrode, 258c: electrode, 258d: electrode, 300: transistor, 302: transistor, 400: substrate, 401: gate electrode layer, 402: gate insulating layer, 404: first oxide semiconductor layer, 404a: island-shaped first oxide semiconductor layer, 406: second oxide semiconductor layer, 406a: island-shaped second oxide semiconductor layer, 408a: source electrode layer, 408b: drain electrode layer, 412: oxide insulating layer, 414: electrode layer, 416: interlayer insulating layer, 418: interlayer insulating layer, 450: transistor, 451: transistor, 500: substrate, 501: gate electrode layer, 502: gate insulating layer, 504a: island-shaped first oxide semiconductor layer, 506a: island-shaped second oxide semiconductor layer, 508a: source electrode layer, 508b: drain electrode layer, 516: interlayer insulating layer, 518: interlayer insulating layer, 520: island-shaped oxide insulating layer, 550: transistor, 580: first substrate, 581: transistor, 583: insulating layer, 584: insulating layer, 585: insulating layer, 587: first electrode layer, 588: second electrode layer, 590a: black region, 590b: white region, 594: cavity, 595: filler, 596: second substrate, 2700: e-book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar battery cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eyepiece, 3054: operation switch, 3055: display portion (B), 3056: battery, 3057: display portion (A), 4001: first substrate, 4002: pixel portion, 4003: signal line drive circuit, 4004: scan line drive circuit, 4005: sealant, 4006: second substrate, 4008: liquid crystal layer, 4010: transistor, 4011: transistor, 4013: liquid crystal element, 4014: insulating layer, 4015: connection terminal electrode, 4016: terminal electrode, 4018: FPC, 4019: anisotropic conductive layer, 4020: insulating layer, 4021: insulating layer, 4030: pixel electrode layer, 4031: counter electrode layer, 4032: insulating layer, 4033: insulating layer, 4035: spacer, 4040: conductive layer, 4501: first substrate, 4502: pixel portion, 4503a: signal line drive circuit, 4503b: signal line drive circuit, 4504a: scan line drive circuit, 4504b: scan line drive circuit, 4505: sealant, 4506: second substrate, 4507: filler, 4509: transistor, 4510: transistor, 4511: light-emitting element, 4512: electroluminescent layer, 4513: second electrode layer, 4514: protective insulating layer, 4515: connection terminal electrode, 4516: terminal electrode, 4517: first electrode layer, 4518a: FPC, 4518b: FPC, 4519: anisotropic conductive layer, 4520: partition, 4540: conductive layer, 4541: insulating layer, 4544: insulating layer, 9600: television set, 9601: housing, 9603: display portion, 9605: stand, 9607: display portion, 9609: operation key, and 9610: remote controller.

The invention claimed is:

1. A method for manufacturing a semiconductor device, comprising the steps of:
forming a gate electrode layer over a substrate having an insulating surface;
forming a first oxide insulating layer which covers the gate electrode layer;
forming a first oxide semiconductor layer over the gate electrode layer and the first oxide insulating layer;
performing first heat treatment so as to form a crystal region in which c-axis is aligned in a direction substantially perpendicular to a surface of the first oxide semiconductor layer;
forming a second oxide semiconductor layer over the first oxide semiconductor layer;
performing second heat treatment so as to crystallize at least a part of the second oxide semiconductor layer by causing crystal growth from the crystal region;
forming a source electrode layer and a drain electrode layer over the second oxide semiconductor layer;
forming a second oxide insulating layer which covers the second oxide semiconductor layer, the source electrode layer, and the drain electrode layer;
performing third heat treatment so as to supply oxygen to the second oxide semiconductor layer;
forming a nitride insulating layer containing hydrogen over the second oxide insulating layer; and
performing fourth heat treatment so as to supply hydrogen at least to an interface between the first oxide semiconductor layer and the first oxide insulating layer.

2. The method for manufacturing a semiconductor device according to claim 1, wherein the first heat treatment causes the crystal growth from the surface of the first oxide semiconductor layer toward an inside to form the crystal region.

3. The method for manufacturing a semiconductor device according to claim 1, wherein the step of forming the source electrode layer and the drain electrode layer includes the steps of:
forming a conductive layer over the second oxide semiconductor layer; and
etching the conductive layer.

4. The method for manufacturing a semiconductor device according to claim 1, wherein the crystal growth is occurred by using a crystal in the crystal region as a crystal seed.

5. The method for manufacturing a semiconductor device according to claim 1, wherein a hydrogen concentration in the nitride insulating layer is higher than or equal to $1 \times 10^{21}$ atoms/cm$^3$.

6. The method for manufacturing a semiconductor device according to claim 1, wherein the first heat treatment is performed at higher than or equal to 450° C. and lower than or equal to 850° C. in a nitrogen atmosphere, an oxygen atmosphere, or a dry air atmosphere.

7. The method for manufacturing a semiconductor device according to claim 1, wherein the second heat treatment is performed at higher than or equal to 450° C. and lower than or equal to 850° C. in a nitrogen atmosphere, an oxygen atmosphere, or a dry air atmosphere.

8. The method for manufacturing a semiconductor device according to claim 1, wherein the third heat treatment is performed at higher than or equal to 200° C. and lower than or equal to 450° C.

9. The method for manufacturing a semiconductor device according to claim 1, wherein the fourth heat treatment is performed at higher than or equal to 150° C. and lower than or equal to 450° C.

10. A method for manufacturing a semiconductor device, comprising the steps of:
forming a first oxide semiconductor layer;
performing first heat treatment to the first oxide semiconductor layer so as to form a crystal region in which c-axis is aligned in a direction substantially perpendicular to a surface of the first oxide semiconductor layer;
forming a second oxide semiconductor layer over the first oxide semiconductor layer;
performing second heat treatment so as to crystallize at least a part of the second oxide semiconductor layer by causing crystal growth from the crystal region;
forming an oxide insulating layer which covers the second oxide semiconductor layer;

performing third heat treatment to the oxide insulating layer;
forming a nitride insulating layer containing hydrogen over the oxide insulating layer; and
performing fourth heat treatment to the nitride insulating layer containing hydrogen.

11. The method for manufacturing a semiconductor device according to claim 10, wherein the first oxide semiconductor layer is formed over a substrate having an insulating surface.

* * * * *